US006522182B2

(12) United States Patent
Tomita et al.

(10) Patent No.: US 6,522,182 B2
(45) Date of Patent: *Feb. 18, 2003

(54) INTEGRATED CIRCUIT DEVICE INCORPORATING DLL CIRCUIT

(75) Inventors: Hiroyoshi Tomita; Naoharu Shinozaki; Nobutaka Taniguchi; Waichirou Fujieda; Yasuharu Sato; Kenichi Kawasaki; Masafumi Yamazaki; Kazuhiro Ninomiya, all of Kawasaki (JP)

(73) Assignee: Fujitsu Limited, Kanagawa (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 14 days.

(21) Appl. No.: 09/385,008

(22) Filed: Aug. 27, 1999

(65) Prior Publication Data

US 2001/0043100 A1 Nov. 22, 2001

(30) Foreign Application Priority Data

Oct. 20, 1998 (JP) .............................................. 10-298478

(51) Int. Cl.[7] .............................. H03L 7/06; H03K 5/00
(52) U.S. Cl. ....................... 327/158; 327/530; 327/152; 327/531
(58) Field of Search ................................ 327/535, 536, 327/538, 158, 156, 532, 531

(56) References Cited

U.S. PATENT DOCUMENTS 5,087,829 A * 2/1992 Ishibashi et al. ............ 327/152

| 5,132,555 A | * | 7/1992 | Takahashi | 327/540 |
|---|---|---|---|---|
| 5,394,077 A | * | 2/1995 | Atsumi | 323/223 |
| 5,640,112 A | * | 6/1997 | Goto et al. | 327/141 |
| 5,945,846 A | * | 8/1999 | Iwao et al. | 327/295 |
| 5,973,525 A | * | 10/1999 | Fujii | 327/158 |
| 6,020,781 A | * | 2/2000 | Fujioka | 327/536 |
| 6,072,345 A | * | 6/2000 | Ooishi | 327/157 |
| 6,081,145 A | * | 6/2000 | Bandai et al. | 327/231 |

FOREIGN PATENT DOCUMENTS

| JP | 3-273710 | 12/1991 |
|---|---|---|
| JP | 10-112182 | 4/1998 |
| JP | 10-171774 | 6/1998 |

* cited by examiner

Primary Examiner—Dinh T. Le
(74) Attorney, Agent, or Firm—Arent Fox Kintner Plotkin & Kahn

(57) ABSTRACT

In the present invention, an external power source supplied to an integrated circuit device is divided into a first external power source for the DLL circuit and a second external power source for circuits other than the DLL circuit. According to the present invention, it is arranged that power source noise generated in the second external power source cannot be transmitted to the variable delay circuit by utilizing the first external power source preferably for the variable delay circuit of the DLL circuit and even more preferably for its delay unit. Also, preferably, it is arranged that power source noise generated in the second external power source cannot be transmitted to the phase coincidence detection unit by utilizing the first power source for the phase coincidence detection unit in the phase comparison circuit of the DLL circuit. Also, by connecting the first external earthing power source to the variable delay circuit and/or phase coincidence detection unit, the effect of power source noise from the second external earthing power source originating from the operation of circuits other than these is suppressed.

30 Claims, 23 Drawing Sheets

Prior Art DLL

FIG. 2
Variable Delay Circuit
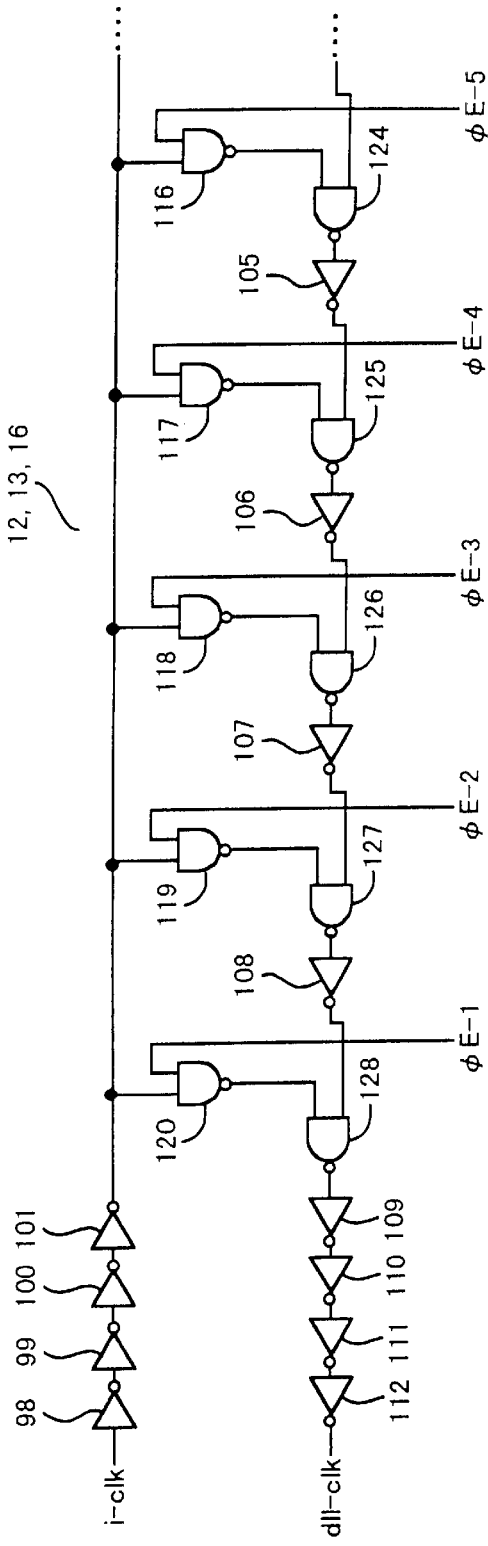
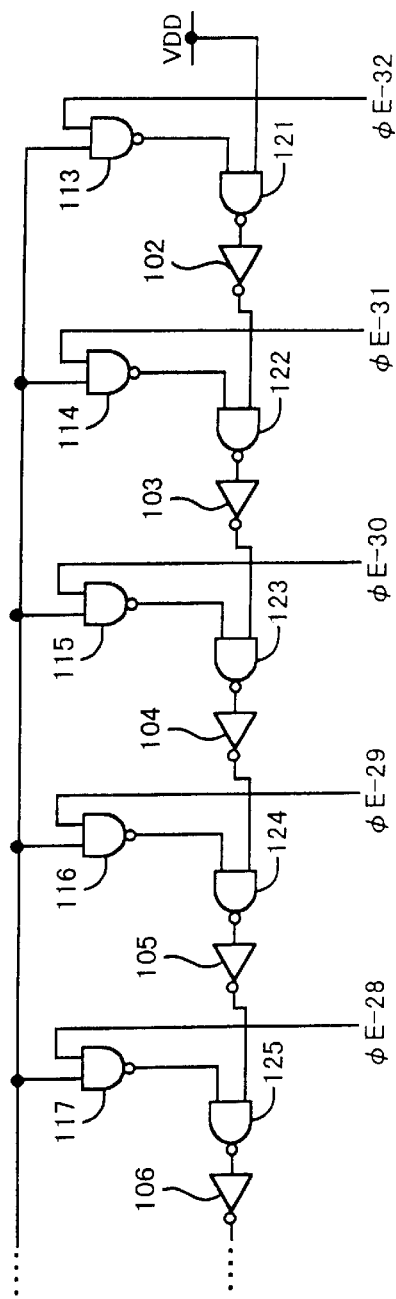

Phase Comparison Unit of Phase Comparator

Operation of Phase Comparison Unit

Operation of Output Unit of Phase Comparison Circuit

FIRST EMBODIMENT

VARIABLE DELAY CIRCUIT OF FIG.9

FIG. 11 THIRD EMBODIMENT

FIG. 12 FOURTH EMBODIMENT

INTERNAL POWER SOURCE SYSTEM FOR Vii

BOOSTED VOLTAGE GENERATOR FOR DLL

Control Voltage Generator for DLL

Internal Power Source Circuit VRnD for DLL

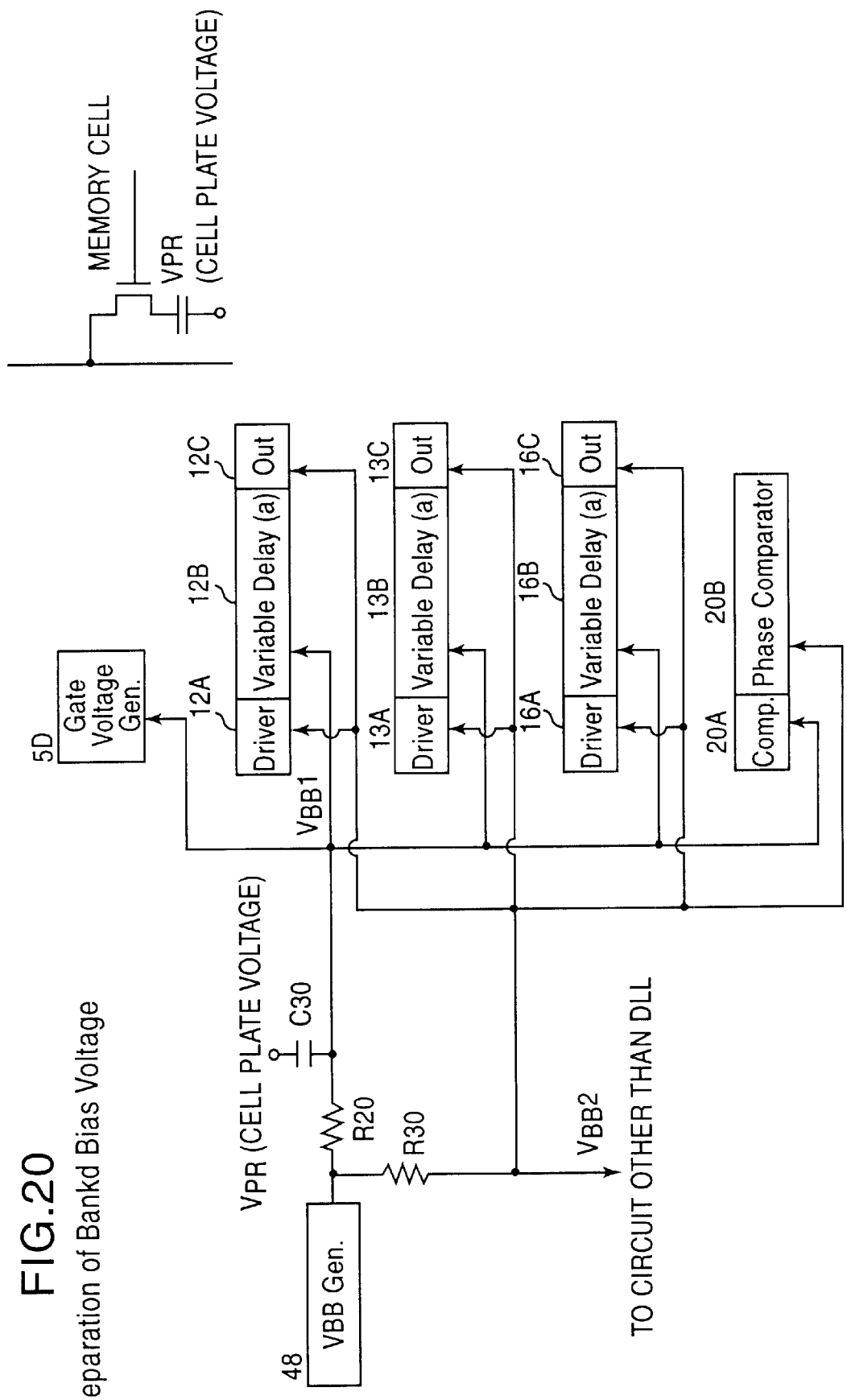
FIG.20 Separation of Bankd Bias Voltage

FIG.21
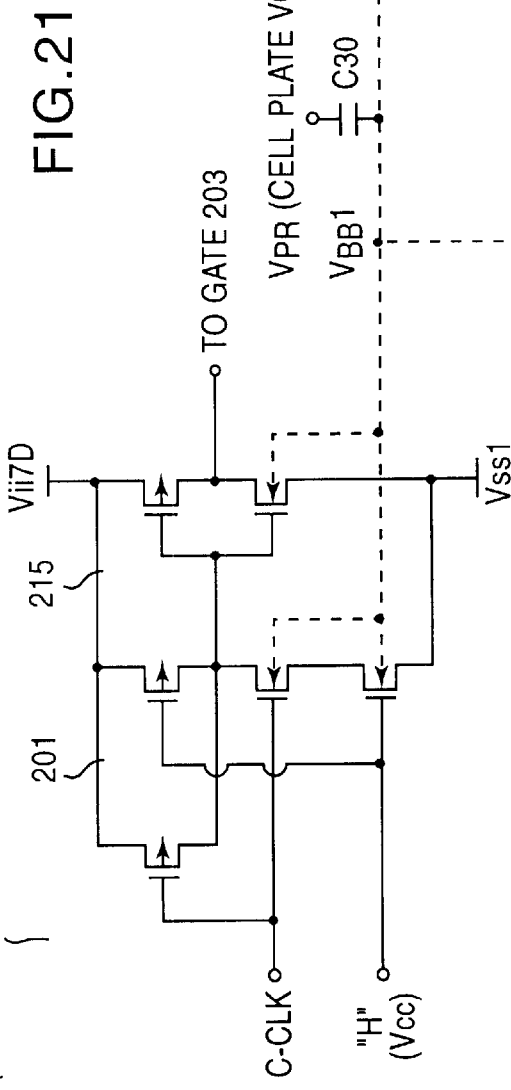
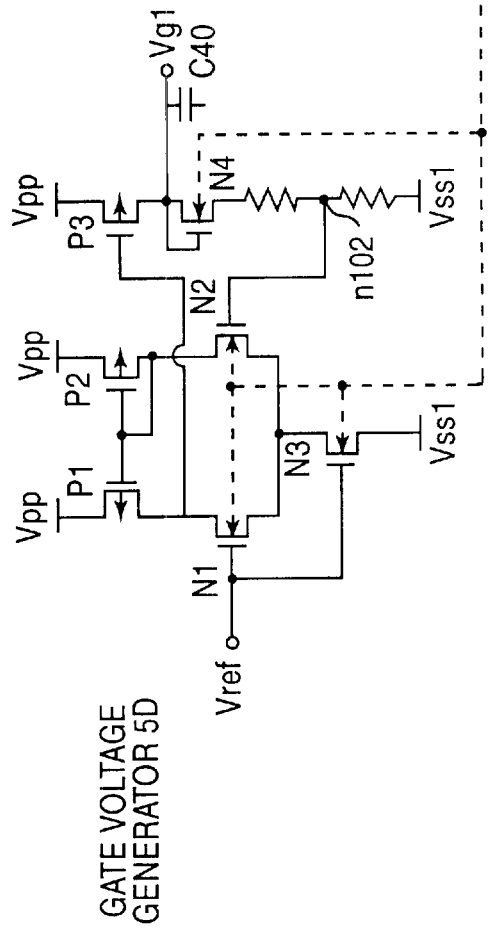

Back Bias for NMOS of G1~G13 is separated

Clock Signal Wirings(L1~L11) are shielded by above and below Wiring

Clock Signal Wirings(L1~L11) are shielded by Same Layer Wiring

INTEGRATED CIRCUIT DEVICE INCORPORATING DLL CIRCUIT

BACKGROUND OF THE INVENTION

1. Field of the Invention

The present invention relates to an integrated circuit device incorporating a DLL (Delay Locked Loop) circuit and in particular relates to an integrated circuit device provided with a DLL circuit in which the accuracy of the phase regulation function of the DLL circuit is increased by reducing the effect of power source noise etc. applied through the power source from other circuits within the integrated circuit device.

2. Description of the Related Art

In synchronous integrated circuit devices such as synchronous DRAMs (SDRAMs), the internal circuitry is operated synchronously with a reference clock that is supplied from outside or with the timing of a prescribed phase relationship with the reference clock. For this purpose, they are provided internally with a timing clock generating circuit.

In such a timing clock generating circuit, a DLL circuit is employed in order to eliminate the effect of propagation delay of the reference clock in the integrated circuit device. Specifically, a DLL circuit comprises: a variable delay circuit that outputs a control clock having a prescribed timing by delaying the reference clock, and a phase comparison circuit and delay control circuit that compare the phases of the reference clock and the variable clock that is delayed therefrom, and regulate the amount of delay of the variable delay circuit such that these phases match. The basic layout of such a DLL circuit is shown for example in Laid-Open Japanese Patent Application No. H.10-112182 (laid open: Apr. 28, 1998).

FIG. 1 is a layout diagram of a prior art DLL circuit. In FIG. 1, there are shown a DLL circuit 1, an output circuit 2 and, as an example of a circuit other than a DLL circuit, an input buffer 3. The power source that is supplied to DLL circuit 1 is constituted by an internal power source Vii1 that is stepped down from an external power source. This stepped down internal power source Vii1 is generated by an internal power source system comprising a boosted power source generating circuit 4 that is supplied with external power Vcc and Vss and that generates boosted power Vpp by boosting up power vcc, a control, voltage (gate voltage) generating circuit 5 that generates a gate voltage Vg constituting a control voltage that is controlled to be constant and whose power is supplied by boosted power source Vpp, and an internal power source circuit VR1 that generates an internal power Vii1 that is lower by the amount of the threshold voltage of transistor Q1 from the gate voltage Vg.

In input buffer 3, there are provided input buffers 11, 10 that fetche clock CLK and its inverted clock /CLK into the interior from outside, and a dummy input buffer 18 that is utilized as part of the DLL circuit. Clocks /CLK0, CLK0 that are obtained from input buffers 10, 11 are respectively delayed by passing through variable delay circuits 12, 13 and are supplied to a data output buffer 14 as control clocks /CLK1, CLK1 controlled to prescribed phases. Data from inside, not shown, is output to the outside as output data Dout in response to these phase-controlled clocks /CLK1, CLK1. External power sources VccQ, VssQ for the external buffer, different from the ordinary external power sources Vcc and Vss are therefore supplied to this output buffer 14.

The feedback loop of the DLL circuit is supplied with a clock c-clk obtained by frequency division to a lower frequency by means of frequency divider 15 of internal clock CLK0. This reference clock c-clk is supplied as one input of phase comparison circuit 20. Whereas a variable clock d-i-clk after being delayed by variable delay circuit 16, dummy data output buffer 17, and dummy input buffer 18 is supplied to the other input of phase comparison circuit 20. The result of this phase comparison is supplied to phase control circuit 21, and phase control circuit 21 regulates the amount of delay of variable delay circuits 12, 13, 16 such that the phases of the two input clocks coincide. That is, a common delay control signal N21 is supplied to these variable delay circuits 12, 13, 16.

Apart from the above output buffer, the control clock is sometimes supplied to other prescribed internal circuitry so that the operating timings of this internal circuitry can be controlled. For example, the control clock may be supplied to an input buffer.

As described above, in the DLL circuit according to the prior art example, internal power source Vii1 for the DLL circuit is generated by an internal power source circuit VR1 exclusively for the DLL circuit 1, in order to avoid the effect of power source noise from the rest of the circuits. To circuits other than the DLL circuit 1, such as input buffer 3, external power source Vcc is supplied, or internal power source Vii2 from internal power source circuit VR2, which is different from internal power source circuit VR1 which is exclusively for the DLL circuit 1 is supplied. Also, to output circuit 2, which requires large current, external power sources VccQ, VssQ for the output circuit 2, which are different from the ordinary external power sources Vcc and Vss are supplied. Also, to DLL circuit 1, circuit 3 other than DLL circuit and power source systems 4, 5, externally earthed power source Vss is supplied.

However, the internal power source Vii1 that is stepped down in voltage and that drives the DLL circuit 1 is supplied to all the constituent elements of the DLL circuit 1. Consequently, power source noise is generated in internal power source Vii1 by the operation of each of the constituent elements of the DLL circuit. Thus, the power source noise generated by operation of some constituent elements of the DLL circuit affects the operation of other constituent elements. For example, when the inverted clock /CLK1 passes through the variable delay circuit 12, power source noise is produced in internal power source Vii1 by the operation of variable delay circuit 12 with the result that the amount of delay of other variable delay circuits 13, 16 that are driven by the same internal power source Vii1 fluctuates because of the effect of this power source noise. As a result, jitter (variation of phase) of the control clock is caused, making precise phase regulation difficult.

More specifically, when the reference clock c-clk and the variable clock d-i-clk passed through variable delay circuit 16 and dummy delay circuits 17, 18 go into the lock-on condition, power source noise is generated in internal power source Vii1 by the action of the other variable delay circuits 12, 13; this affects the operation of the variable delay circuit 16 in the feedback loop referred to above, causing its delay amount to change and in some cases may produce an unlocked condition. When this happens, even though the external clocks CLK, /CLK and control clocks CLK1, /CLK1 are in the lock-on condition, they are put into the unlocked condition by power source noise; this therefore results in jitter of the control clocks CLK1 and /CLK1, causing inaccurate timing of the output of data output Dout.

Also, as another example, phase comparison circuit 20 is provided with a phase coincidence detection unit for detecting whether or not the phase difference between the input clocks c-clk and d-i-clk is in the lock-on condition. In some cases, this phase coincidence detection unit, due to the effects of power source noise produced by the operation of variable delay circuits, detects the unlocked condition irrespective of the lock-on condition. In this case also, the delay control circuit 21 controls the amount of delay of variable delay circuit 16 in accordance with this phase comparison result and tries to achieve the lock-on condition, but at this point the effect of power source noise disappears so unlocking in respect of the variable clock d-i-clk after alteration of this delay amount is now detected, so delay control circuit 21 again controls the amount of delay of variable clock 6. Such phenomena cause jitter of the control clocks CLK1, /CLK1.

Furthermore, in the prior art example, external power sources Vcc and Vss are supplied to internal power source circuit VR1 which is exclusively for the DLL circuit 1; furthermore, the external ground power source Vss is also supplied to the control voltage (gate voltage) generating circuit 5 that generates a gate voltage Vg that is supplied to internal power source circuit VR1, and, moreover, external power sources Vcc and Vss are also supplied to boosted power source generating circuit 4 that generates boosted power source Vpp.

However, for example boosted power source generating circuit 4, with its pumping action of large current for generating the boosted power source, tends to generate power source noise in external power sources Vcc and Vss. Also, power source noise is generated in external power sources Vcc and Vss by the large current drive action of the word line or bit line that occurs on reading or writing of the memory circuit, not shown. Such power source noise produces fluctuation of the level of the gate voltage Vg generated by control voltage (gate voltage) generating circuit 5 for the DLL circuit and, furthermore, produces fluctuation of the level of the internal power source Vii1 generated by internal power source circuit VR1. As a result, due to the power source noise generated in internal power source Vii1, the amount of delay of the variable delay circuit within the DLL circuit fluctuates, thereby affecting the operation of the phase coincidence detection unit within the phase comparison circuit, causing jitter of the control clock, as mentioned above.

In future, when clock frequencies are made even higher, the effect of power source noise on the internal power source Vii1 from other constituent elements within the DLL circuit and/or the effect of power source noise on external power sources Vcc, Vss from circuits other than the DLL circuit will become impossible to ignore and the occurrence of clock jitter produced by these effects will have to be solved.

SUMMARY OF THE INVENTION

Accordingly, an object of the present invention is to provide an integrated circuit device having a DLL circuit in which jitter produced by power source noise is suppressed.

A further object of the present invention is to provide an integrated circuit device having a DLL circuit in which the effect of power source noise on the amount of delay of the variable delay circuit is suppressed.

A further object of the present invention is to provide an integrated circuit device having a DLL circuit in which the effect of power source noise on lock-on detection of the phase comparison circuit is suppressed.

A further object of the present invention is to provide an integrated circuit device in which the effect of power source noise on the internal power source system for the DLL circuit is suppressed.

Yet a further object of the present invention is to provide an integrated circuit device in which the effect of power source noise on the internal power source for the DLL circuit is suppressed.

In order to achieve the above objects, according to a first aspect of the invention, an external power source supplied to an integrated circuit device is divided into a first external power source for the DLL circuit and a second external power source for circuits other than the DLL circuit. The concept of "external power source" as referred to herein includes a ground power source (or earthing power source) and a power source different therefrom by a fixed voltage which are supplied from outside. Also, a power source different from the ground power source may be referred to simply as an external power source.

According to the present invention, it is arranged that power source noise generated in the second external power source cannot be transmitted to the variable delay circuit by utilizing the first external power source preferably for the variable delay circuit of the DLL circuit and even more preferably for its delay unit. Also, preferably, it is arranged that power source noise generated in the second external power source cannot be transmitted to the phase coincidence detection unit by utilizing the first power source for the phase coincidence detection unit (or simply comparison unit) in the phase comparison circuit of the DLL circuit. Also, by connecting the first external earthing power source to the variable delay circuit and/or phase coincidence detection unit, the effect of power source noise from the second external earthing power source originating from the operation of circuits other than these is suppressed.

According to the present invention, even more preferably, the internal power source system for the DLL circuit is divided into separate parts, namely, a part that supplies internal power source to the phase coincidence detection unit of the phase comparison circuit and/or the variable delay circuit in the DLL circuit, and a part that supplies internal power source to the constituent elements of the DLL circuit other than these. As a result, power source noise generated in the DLL circuit is arranged not to be transmitted to the internal power source of the phase coincidence detection unit and/or variable delay circuit, which are most critical to the accuracy of the phase regulation action of the DLL circuit. Furthermore, preferably, the internal power source circuits for the DLL that supply internal power source to the variable delay circuit or phase coincidence detection unit are separately constituted. As a result, mutual power source noise effects between the variable delay circuit and phase coincidence detection unit can be avoided.

Furthermore, according to the present invention, when an internal power source that is stepped down in voltage from the external power source is utilized in a circuit other than the DLL circuit, its internal power source circuit is provided independently of the internal power source circuit for the DLL for the phase coincidence detection unit and/or variable delay circuit of the DLL circuit. Furthermore, the control voltage generating circuit that supplies control voltage based on the internal power source to the internal power source circuit for the DLL is separately constituted from the control voltage generating circuit of the internal power source circuit for a circuit other than the DLL circuit. By suppressing the effect of power source noise on the control voltage (gate voltage), the operation of the DLL circuit can be made more precise.

Furthermore, according to the present invention, the external power source for output that is supplied to the integrated circuit device is divided into a first external power source for output for a dummy output buffer within the delay loop of the DLL circuit and a second external power source for output for the ordinary output buffer. By suppressing transmission of power source noise generated by the operation of the ordinary output buffer to the power source of the dummy output buffer of the DLL circuit that performs phase regulation of the clock, the amount of delay of the dummy output buffer is kept constant, making it possible to achieve stable phase regulation.

In order to achieve the above object, according to a second aspect of the invention, in order to suppress the effect of power source noise between the circuits constituting the DLL circuit, an internal power source circuit for the DLL is provided respectively independently for each of the plurality of variable delay circuits to which different clocks are supplied and pass therethrough.

Furthermore, according to the second aspect of the invention, preferably, the power sources of the delay unit, which is an item within the variable delay circuit that has comparatively little charging/discharging current is separated from the power source of the drive unit and output unit, which are items within the variable delay circuit that have comparatively large charging/discharging current. Thus, the delay unit is supplied with stepped-down internal power source from the internal power source circuit for the DLL. Further, although stepped-down internal power source is supplied to the drive unit, this drive unit is supplied with internal power source from an internal power source circuit for circuits other than the DLL circuit or internal power source circuit for the DLL independent of these circuits other than the DLL. If stepped down internal power source is supplied to the output unit, the internal power source supply is made in the same way as that of the drive unit. Also, external power source may be directly supplied to the output unit. In this case, preferably, a second external power source for a circuit other than the DLL circuit different from the first external power source for the DLL is supplied to the output unit. However, since the drive current amount of the voltage level conversion unit within the output unit is small and its power source noise is small, preferably it is supplied with first external power source.

Furthermore according to the second aspect of the invention, preferably, the power source of the delay element of the phase coincidence detection unit of the phase comparison circuit and the power source of items other than this are made separate. An internal power source that is stepped down from the internal power source for the DLL is supplied to the delay element of the phase coincidence detection unit. When stepped-down internal power source is supplied also to the circuits other than this, internal power source from the internal power source circuit for the circuits other than the DLL circuit or internal power source circuit for the DLL circuit that is separated from the internal power source circuit for the DLL circuit for the phase detection unit is supplied. Alternatively, external power source may be directly supplied to circuits other than the phase coincidence detection unit. In this case, preferably, a second external power source is supplied.

Thus, according to the second aspect of the invention, the delay unit of the variable delay circuit or the phase coincidence detection unit of the phase comparison circuit are supplied with internal power source from an internal power source circuit for the DLL that generates internal power source stepped down from the first external power source, and respective delay units or the phase coincidence detection unit are supplied with internal power source from respectively separate internal power source circuits for the DLL. As a result, the effect of power source noise on these delay characteristics can be suppressed.

Further, in order to achieve the above object, according to a third aspect of the invention, in an internal power source circuit for the DLL that supplies internal power source voltage stepped down from external voltage to the delay units of the variable delay circuit or the phase coincidence detection unit of the phase comparison circuit, the internal power source voltage is stabilized. With this purpose in view, it is arranged for a first external power source for the DLL to be supplied to the internal power source circuit for this DLL, so that noise from the second external power source is not transmitted. Further, the current supply capability of the internal power source circuit for this DLL is made to be approximately proportional to the power consumption of the respectively corresponding delay unit and/or phase coincidence detection unit. As a result, each internal power source circuit for the DLL can supply internal power source voltages having practically the same potential to each corresponding circuit.

Furthermore, according to the third aspect of the invention, in order to stabilize the control voltage (gate voltage) that is supplied to each internal power source circuit, a low-pass filter is inserted between the control voltage generating circuit and internal power source circuit, so as to cut off noise from the control voltage generating circuit. Furthermore, according to the third aspect of the invention, the internal power source circuit comprises a source follower type transistor whose drain is connected to a first external power source, whose gate is supplied with control voltage and whose source outputs internal power source; and a current circuit that extracts a prescribed current from the transistor provided between the source of this transistor and the earthing power source. More preferably, the amount of current that this current circuit extracts is dynamically controlled such that it is small in power-down mode but is larger in non-power-down mode. As a result, even if the delay units of the variable delay circuit and/or phase coincidence detection unit of the phase comparison circuit that are supplied with the internal power source do not consume current during power-down mode, a prescribed amount of current is absorbed by the current circuit, so the voltage of the source of the transistor can be prevented from rising excessively. Furthermore, in active mode, since the current circuit absorbs more current, even if current is consumed intermittently corresponding to the phase of the clock that is supplied by the variable delay units and/or phase coincidence detection unit, excessive rising or falling of the voltage of the source of the transistor can be prevented.

Furthermore, according to the third aspect of the invention, in order to stabilize the control voltage (gate voltage) of the control voltage (gate voltage) generating circuit that supplies control voltage to the internal power source circuit for the DLL, for the earthing power source of the control voltage generating circuit, the earthing power source of the first external power source is utilized. Furthermore, preferably, the control voltage generating circuit comprises an operational amplifier and a circuit construction whereby negative feedback of its output is effected to one input, the earthing power source wiring of the first external power source being arranged in parallel in the vicinity of a resistive element in the negative feedback circuit. The effect of power source noise to the resistive element can be suppressed by the shielding function of the earthing power source wiring of the first external power source, which is little affected by power source noise. Further, according to the third aspect of the invention, gate voltage from a common control voltage generating circuit is supplied to a plurality of internal power source circuits for the DLL. As a result, internal power sources of the same potential can be generated for the plurality of internal power source circuits for the DLL.

In order to achieve the above object, according to a fourth aspect of the invention, a second external power source is supplied to a boosted power source generating circuit that supplies a boosted power source to a control voltage generating circuit for the DLL. Since such a boosted power source generating circuit for the DLL generates boosted power source by a pumping action using the external power source, considerable power source noise is generated in this external power source. Consequently, according to the fourth aspect of the invention, by supplying a second external power source to the boosted power source generating circuit for this DLL, it is arranged that this power source noise is not transmitted to the first external power source.

According to the fourth aspect of the invention, preferably, the boosting action of the boosted power source generating circuit for the DLL is made slower than that of the boosted power source generating circuit for items other than the DLL. Alternatively, the amount of charge utilized in a single voltage boosting cycle in the boosted power source generating circuit for the DLL is made smaller. Furthermore, by inserting a resistance etc. in the boosted power source generating circuit for the DLL, the fluctuation of potential of the boosted power source produced by this pumping action is minimized. Also, preferably, a low-pass filter is inserted between the boosted power source generating circuit for the DLL and the control voltage generating circuit for the DLL. As a result, fluctuation of potential of the boosted power source produced by the pumping action of the boosted power source generating circuit can be prevented from being transmitted to the control voltage generating circuit.

As described above, according to the fourth aspect of the invention, it is possible to prevent power source noise generated by the boosted power source generating circuit or fluctuation of the boosted power source being transmitted to the control voltage generating circuit or internal power source circuit for the DLL.

In order to achieve the above object, according to a fifth aspect of the invention, a back bias power source that supplies the channel region of a transistor of a delay unit of the variable delay circuit or the phase coincidence detection unit of the phase comparison circuit is made separate from the back bias power source for the transistor of another circuit. By supplying the transistors of the delay units or phase coincidence detection unit with a dedicated back bias power source wherein the effect of noise generated on the back bias power source terminal of the other circuit is small, the threshold values of these transistors can be stabilized, making it possible to raise the precision of the delay time of the delay units and/or the delay time of the phase coincidence detection unit.

According to the fifth aspect of the invention, even more preferably, back bias power source of little noise likewise isolated from the back bias power source of the other circuit is supplied also to the transistors of the internal power source circuit for the DLL and of the control voltage generating circuit for the DLL that supplies control voltage thereto. As a result, the threshold voltage of the transistor that determines the control voltage is stabilized, thereby stabilizing the control voltage. Furthermore, the threshold voltage of the transistor of the internal power source circuit is stabilized, thereby stabilizing the potential of the internal power source.

Preferably, according to the fifth aspect of the invention, a prescribed capacitor is inserted between the isolated back bias voltage and the voltage of the cell plate of a memory cell, thereby further stabilizing the voltage value of the isolated back bias voltage.

In accordance with the objects, according to a sixth aspect of the invention, a control clock whose phase is regulated by the DLL circuit is supplied to a plurality of internal circuits through wirings of equal length, and a buffer circuit that drives the control clock is inserted at the branch points of these wirings of equal length. By arranging the drive buffer on wirings of equal length, the waveform of the control clock that is propagated thereon can be made steep, thereby enabling the effect of power source noise to be minimized.

Further, according to the sixth aspect of the invention, drive buffers equal in number thereto are connected at branch points corresponding to the plurality of wirings of equal length, the same stray capacitance is provided in respect of the wirings of equal length which have few branch leads, thereby equalizing the propagation speed of the control clock of these respective wirings of equal length. Also, the buffer circuits provided at corresponding branch points have respectively the same drive capability. Also, according to the sixth aspect of the invention;, the voltage wirings that supply back bias voltage of the transistors constituting the drive gate circuits are isolated from the wirings of the back bias voltage for the other circuits, thereby making it possible to avoid the operating speed of the drive buffer circuits being affected by the operation of other circuits. In addition, according to the sixth aspect of the invention, wiring of the first power source for the DLL is arranged parallel to the equal-length wiring, and preferably the equal-length wiring is shielded from other signal lines, such that the equal-length wiring is not affected by noise of other signal lines. In this way, the propagation speed of the control clock can be made to be approximately the same between a plurality of equal-length wirings.

BRIEF DESCRIPTION OF THE DRAWINGS

FIG. 2 is a view showing examples of variable delay circuits 12, 13, 16;

FIG. 20 is a view showing the isolation of the back bias power source in an embodiment;

FIG. 21 is a view showing in more detail application of a back bias power source through a transistor according to an embodiment;

FIG. 22 is a view illustrating the layout of clock signal wiring from a variable delay circuit to an output buffer or the like.

DESCRIPTION OF THE PREFERRED EMBODIMENTS

Figure 1:
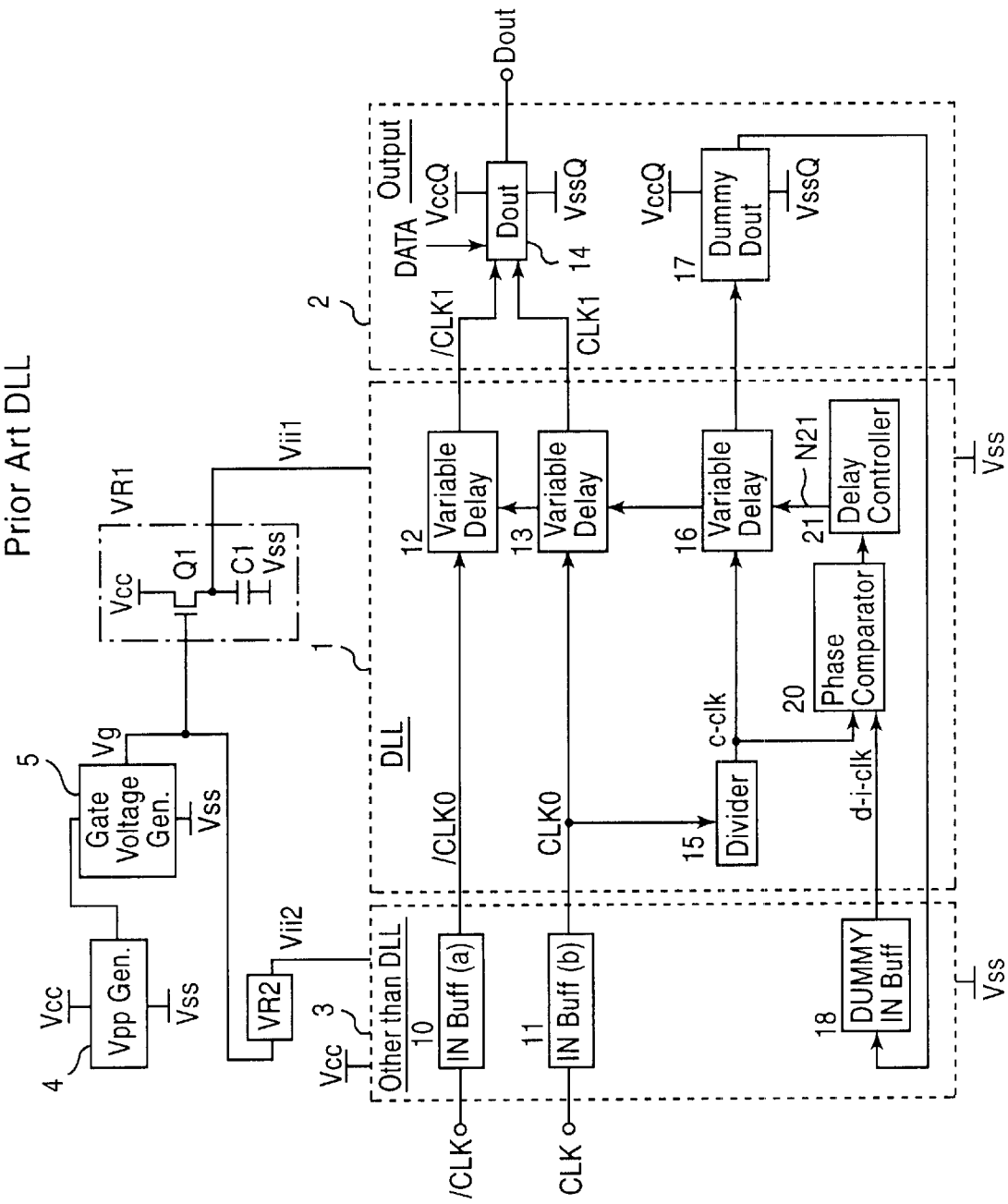
FIG. 1 is a layout diagram of a prior art DLL circuit.

Embodiments of the present invention are described below with reference to the drawings. However, these embodiments are not limitative of the scope of the present invention.

A DLL circuit according to an embodiment of the present invention, like the prior art example, comprises a variable delay circuit, phase comparison circuit, delay control circuit, and dummy delay circuit such as a dummy output buffer and/or dummy input buffer. The arrangement is such as to reduce the jitter of the DLL circuit caused by power source noise, different power sources being supplied to respective constituent elements. A brief description of the constituent elements of the DLL circuit will therefore be given before describing specific embodiments. The embodiments of the present invention described below will be more easily understood by understanding these constituent elements.

[Variable delay circuit]

FIG. 2 shows an example of variable delay circuits 12, 13 and 16. These variable delay circuits output output clock dll-clk obtained by delaying input clock i-clk. The variable delay circuits are constructed as shown in the drawing using a plurality of inverters 98 to 122 and NAND gates 113 to 128. A drive unit that drives the supplied clock is constituted by inverters 98 to 101. Also, a delay unit is constituted by NAND gates 113 to 128 and inverters 102 to 108. Inverters 109 to 112 constitute an output unit that outputs a clock.

To the inputs on one side of NAND gates 113 to 120, there is supplied a clock obtained by delaying input clock i-clk, while to the inputs on the other side is supplied delay control signal $\phi_{E-1}$ to $\phi_{E-32}$. A set of delay control signals $\phi_{E-1}$ to $\phi_{E-32}$ comprise one signal with H level and the remaining signals with L level.

Assuming that delay control signal $\phi_{E-1}$ is H level, the other delay control signals are L level, so all of the outputs of NAND gates 113 to 119 become H level. As a result, all of NAND gates 121 to 127 are L level and all of inverters 102 to 108 become H level. Accordingly, the input clock i-clk is output as output clock dll-clk with an amount of delay of a total of 10 gate stages, namely, the four inverters 98 to 101, NAND gates 120, 128, and the four inverters 109 to 112. This condition is the condition in which the delay amount is a minimum.

Now, every time the H level delay control signal $\phi_{E-1}$ to $\phi_{E-32}$ is shifted to the right-hand side in the drawing, a delay amount corresponding to two gate stages, namely, NAND gate 127 and inverter 108 is added. Thus, when the delay control signal $\phi_{E-32}$ becomes H level, the maximum delay amount is achieved. That is for the delay control signals $\phi_{E-1}$ to $\phi_{E-32}$, when the H level delay control signal is shifted rightwards by 1, the amount of delay is increased to the extent of the two stages constituted by a NAND gate and an inverter, and, when it is shifted leftwards by 1, the amount of delay is likewise decreased in an amount corresponding to two stages.

As is clear from the above description, the amount of delay of the clock in the delay unit is controlled by the delay control signal. It is therefore necessary to ensure that the amount of delay of this delay unit is not affected by the effect of power source noise and/or the effect of noise of the back bias voltage.

[Phase comparison circuit]

Figure 3:
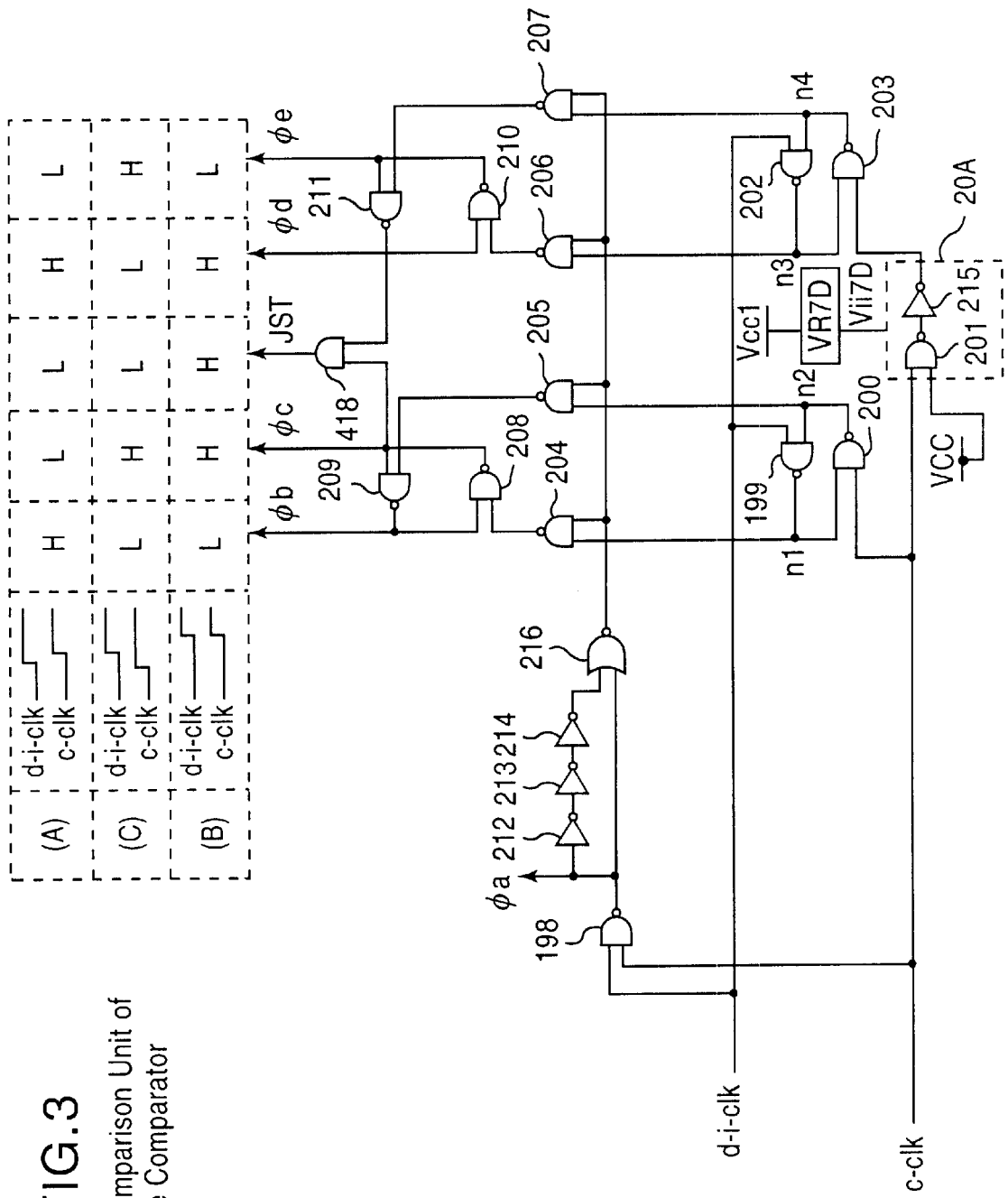
FIG. 3 is a circuit diagram of a phase comparison unit within phase comparison circuit 20.
Figures 4A, 4B, 4C:
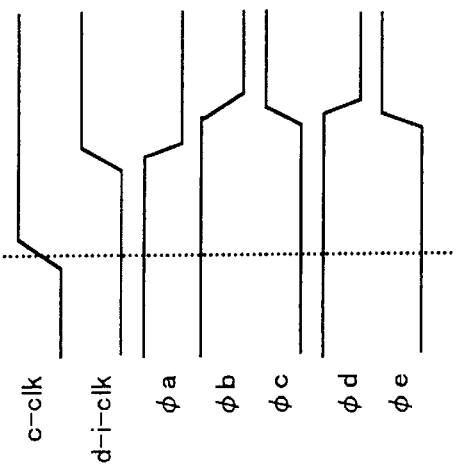
FIG. 4 is a waveform diagram showing the operation of the phase comparison unit.

FIG. 3 is a circuit diagram of the phase comparison unit of phase comparison circuit 20. Also, FIG. 4 is a waveform diagram showing the operation of the phase comparison unit. In this phase comparison unit, in the portion comprising NAND gates 199 to 203 and inverter 205, the phase relationship of reference clock c-clk and the variable clock d-i-clk that is delayed therefrom is detected, and the detection results are generated at nodes n1 to n4. The phase relationship of the two clocks may be classified into the condition where the phase of variable clock d-i-clk leads reference clock c-clk, as shown in (A) of FIG. 4, the condition in which the phases of the two clocks are practically coincident, as shown in (B) of FIG. 4, and the condition in which the phase of the variable clock d-i-clk is delayed from that of the reference clock c-clk as shown in (C) of FIG. 4.

In the case of the condition (A) of FIG. 4, in the condition where both clocks are L level, all of nodes n1 to n4 are H level; after this, the second clock d-i-clk first becomes H level:

n1=L, n2=H, n3=L, n4=H.

Even if subsequently the reference clock c-clk becomes H level with a delay, the condition of the above nodes n1 to n4 does not change. When both clocks become H level, the output of NAND gate 198 becomes L level, causing an H level pulse of prescribed width from the falling edge thereof to be output from NOR gate 216. This H level pulse is supplied as sampling pulse to NAND gates 204 to 207, causing the conditions of nodes n1 to n4 to be respectively latched on a latch circuit consisting of NAND gates 208, 209 and a latch circuit consisting of NAND gates 210, 211. Consequently, as shown in Table 3, the signals φb, φc, φd, φe become: φb=H, φc=L, φd=H, φe=L.

In the condition (B) of FIG. 4, the phase of the variable clock d-i-clk is delayed within the range of the delay time of NAND gate 201 and inverter 215 with respect to reference clock c-clk. In this case, the reference clock cclk becomes H level first, becoming:

n1=H, n2=L and, further, the output of inverter 215 becomes H level later than the variable clock d-i-clk, becoming:

n3=L, n4=H.

Consequently, the two clocks are latched with the timing with which this goes to H level and, as shown in the Table of FIG. 3, the signals φb, φc, φd, φe become:

φb=L, φc=H, φd=H, φe=L.

This case signifies that the phases are coincident, so the lock-on signal JST of the output of AND gate 418 also outputs H level.

As described above, NAND gate 201 and inverter 215 have the same circuit structure as the delay circuit corresponding to a single stage of the delay unit of the variable delay circuit of FIG. 2 and constitute a phase coincidence detection unit 20A (or simply a comparison unit 20A) that detects whether or not the phase difference of reference clock c-clk and variable clock d-i-clk is or is not less than the amount of delay corresponding to one stage of the variable delay circuit. It is important in achieving a stable lock-on detection function that the amount of delay of the gate 210 and inverter 215 constituting this phase coincidence detection unit is unaffected by power source noise and/or noise of the back bias voltage.

In the condition (C) of FIG. 4, reference clock c-clk first becomes H level, whereupon n1=H, n2=L, n3=H, n4=L.

Thereafter, even if there is a lag in variable clock d-i-clk becoming H level, the conditions of the nodes n1 to n4 do not change. This condition is latched with the timing with which both clocks become H level, and, as shown in the Table of FIG. 3, signals φb, φc, φd, φe become:

φb=L, φc=H, φd=L, φe=H.

Figure 5:
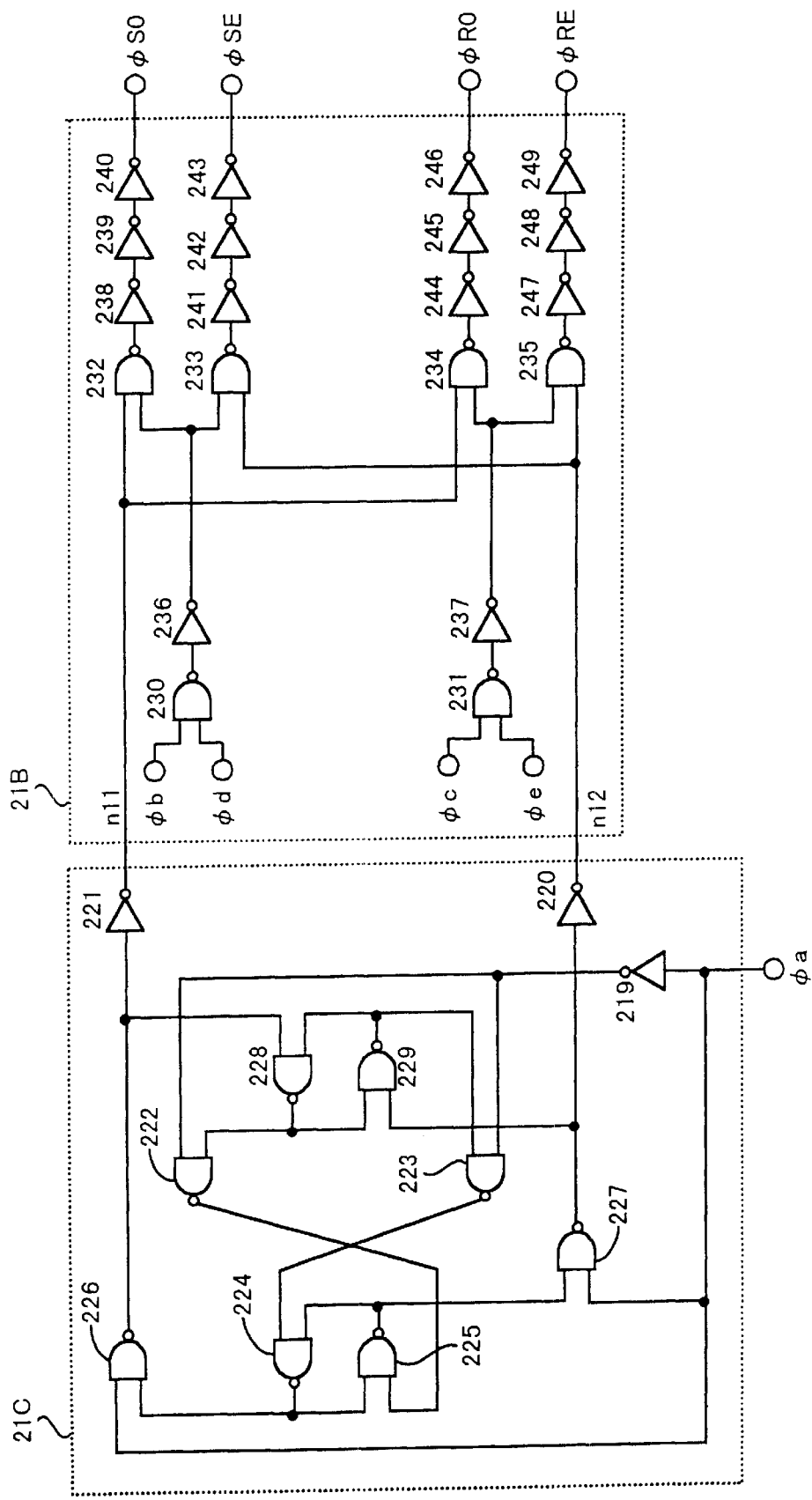
FIG. 5 is a circuit diagram of the phase comparison output unit of phase comparison circuit 20.

FIG. 5 is a circuit diagram of the phase comparison output unit of phase comparison circuit 20. Also, FIG. 6 is a waveform diagram showing the operation of this phase comparison output unit. (A), (B), (C) of the waveform diagram respectively correspond to (A), (B), (C) of FIG. 3 and FIG. 4.

The phase comparison output unit comprises a frequency dividing circuit 20C that divides to one half the frequency of the timing signal φa generated with the timing of the phase comparison of the two clocks, and an output circuit 20B that outputs phase comparison result signals φ$_{SO}$ to φ$_{RE}$ based on the signals φb, φc, φf, φe generated in accordance with the phase relationship of the two clocks in response to the timing of output from this frequency dividing circuit 20C.

Divide-by-two frequency division circuit 20C is constituted by a JK flip-flop; the time when both clocks c-clk, d-i-clk become H level is detected by NAND gate 198 (FIG. 3), and the sampling pulse φa which is obtained therefrom is divided in frequency by a factor of 2, thereby generating inverse-phase pulse signals n11 and n12. Sampling pulse φa is supplied to gates 226 and 227 and its inverted pulse /φa is supplied to gates 222, 223, an inverted signal being transferred between the latch circuit consisting of gates 228 and 229 and the latch circuit consisting of gates 224, 225. As a result, inverted-phase pulse signals n11, n12 that have been divided in frequency by a factor of 2 are generated.

Output circuit 20B decodes the signals φb, φc, φd, φe that are sampled and latched; if the phase of the reference clock c-clk lags that of the variable clock d-i-clk (condition (A)), it makes the output of inverter 236 H level; if the phases of the two clocks coincide (condition (B)), it makes both the outputs of inverter 236 and 237 L level; and, if the phase of reference clock c-clk leads that of variable clock d-i-clk (condition (C)), it makes the output of inverter 237 H level.

Figure 6A:
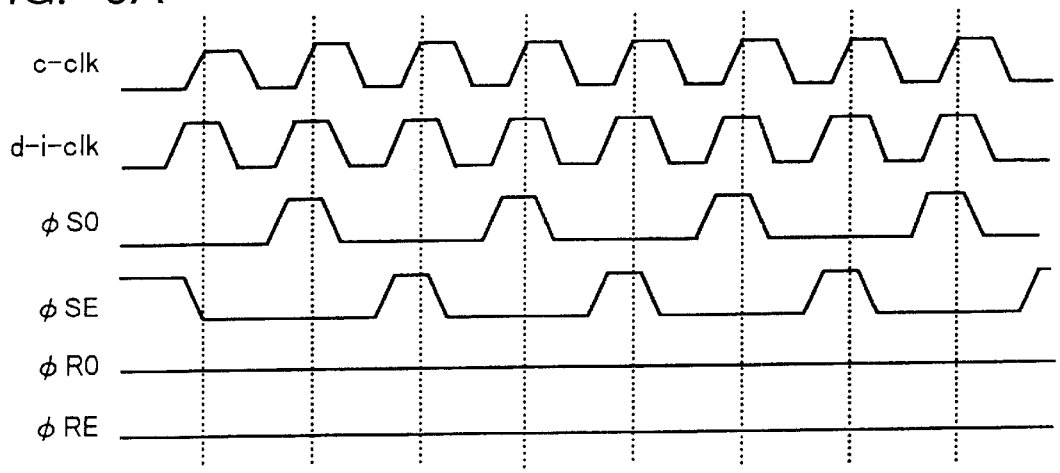
FIG. 6 is a waveform diagram showing the operation of the phase comparison output unit.
Figure 6B:
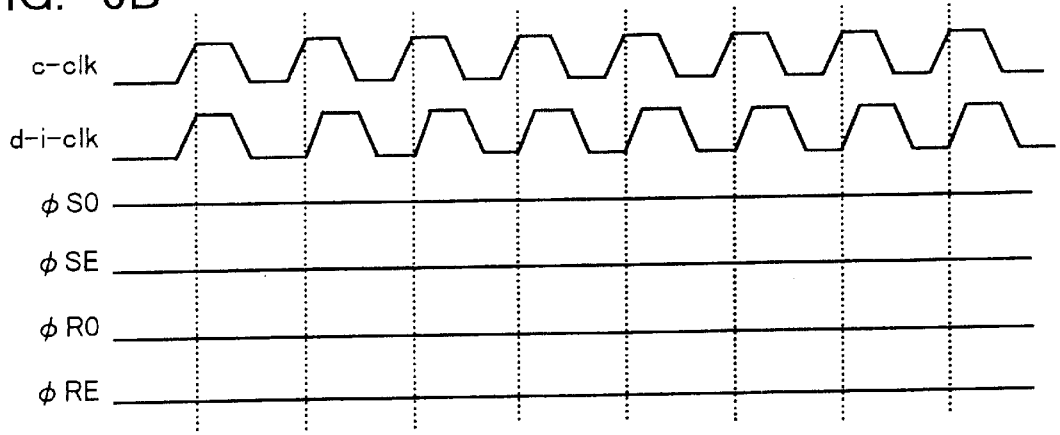
Figure 6C:
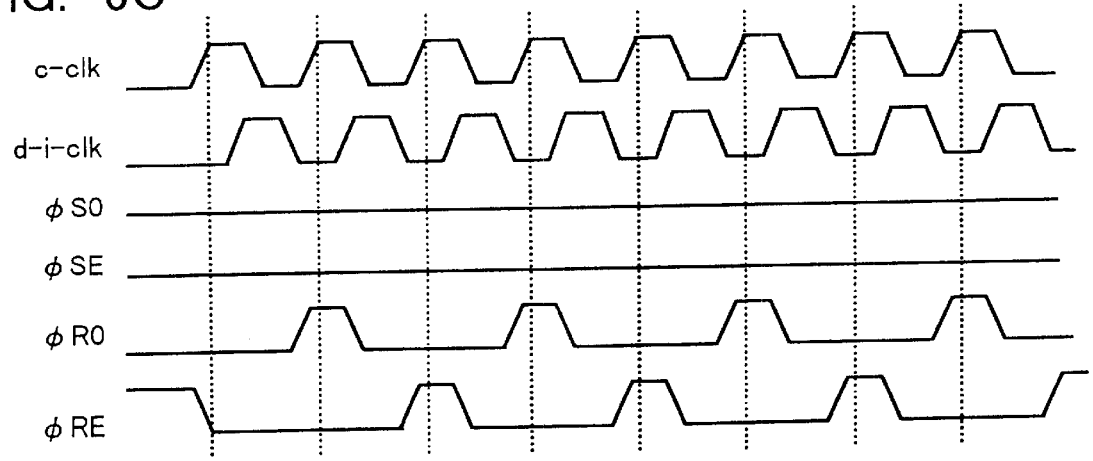

Consequently, in output circuit 20B, by means of the decoding function of NAND gates 232 to 235, when in condition (A) mentioned above, NAND gates 232 and 233 alternately make the phase comparison result signals φ$_{SO}$, φ$_{SE}$ that increase the delay amount of variable delay circuit 13 H level so as to delay the phase of variable clock d-i-clk in response to the timing signals n11, n12. Specifically, this is as shown in FIG. 6(A). But, in condition (B), output circuit 20B, as shown in FIG. 6(B), does not generate phase comparison result signals φ$_{SO}$ to φ$_{RE}$. Furthermore, in condition (C), as shown in FIG. 6(C), NAND gates 234, 235 alternately make the phase comparison result signals φ$_{RO}$, φ$_{RE}$ which decrease the amount of delay of variable delay circuit 13 H level in order to advance the phase of variable clock d-i-clk in response to timing signals n11, n12.

As described above, in phase comparison circuit 20, the delay element consisting of gate 201 and inverter 215 constitutes a circuit 20A for phase coincidence detection. The gate circuits apart from this circuit 20A simply operate in response to a digital signal. Therefore, there is no need to stabilize change of delay characteristic in response to noise, unlike the gate 201 and/or inverter 215.

[Delay control circuit]

Figure 7:
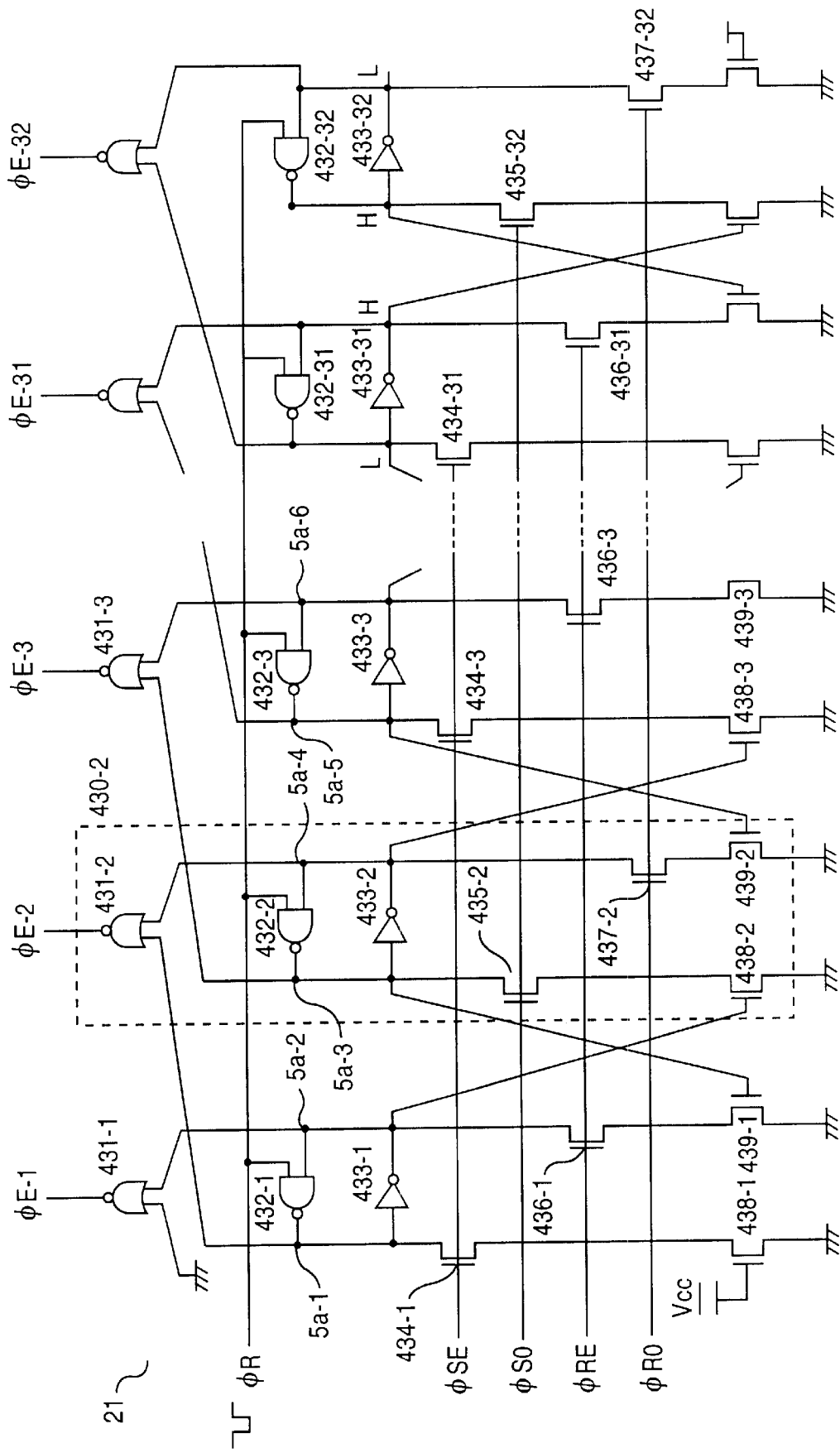
FIG. 7 is a circuit diagram showing the layout of part of a delay control circuit 21.

FIG. 7 is a circuit diagram illustrating part of the layout of delay control circuit 21. Delay control circuit 21 outputs delay control signals φ$_{E-1}$ to φ$_{E-3}$ from NOR gates 431-1 to 431-3 in response to phase comparison result signals φ$_{SO}$ to φ$_{RE}$. As shown in FIG. 2, delay control signals φ$_{E-1}$~φ$_{E-32}$ are constituted by 32 bits.

Delay control circuit 21, in response to phase comparison result signals φ$_{SO}$, φ$_{SE}$, shifts the H-level delay control signal φ$_E$ to the right, thereby increasing the amount of delay of the variable delay circuit, and, in response to phase comparison result signals φ$_{RO}$, φ$_{RE}$, shifts the H level delay control signal φ$_E$ to the left, thereby decreasing the amount of delay of the variable delay circuit.

Each stage of the delay control circuit is respectively provided with a latch circuit consisting for example in the case of the first stage in NAND gate 432-1 and inverter 433-1. It is also provided with transistors 434-1, 436-1 that forcibly invert the condition of latch circuits 432-1 and 433-1 in response to the phase comparison result signals φ$_{SO}$ to φ$_{RE}$. Transistors 438-1, 439-1 are provided in order to ensure that latch circuits other than those which are intended to be inverted are not inverted by transistors 434-n, 436-n. The second stage and third stage circuits are constructed in the same way. All these transistors are N-channel type.

Assuming now that when reset signal φ$_R$ constituted by an L level pulse is applied, the outputs of NAND gates 431-1 to 3 all become H level, all the outputs of inverters 433-1 to 3 become L level. Node 5a-2 therefore becomes L level, and the delay control signal φ$_{E-1}$ of the output of NOR gate 431-1 becomes H level. Also, since node 5a-1, 5a-3 are both H level, the delay control signals φ$_{E-2}$, φ$_{E-3}$ other than these all become L level. That is, in response to the reset signal φ$_R$, the delay control signal φ$_{E-1}$ becomes H level, and the variable delay circuits 13, 14 are controlled to the minimum delay time.

Next, when phase comparison is executed, one or other of the phase comparison result signals φ$_{SO}$ to φ$_{RE}$ becomes H level, depending on the phase relationship of the two clocks. Let us now assume that when phase comparison result signal φ$_{SE}$ becomes H level, transistor 434-1 conducts, forcibly pulling node 5a-1 down to L level and forcibly pulling node 5a-2 of the output of inverter 433-1 up to H level. As a result, the output φ$_{E-1}$ of NOR gate 431-1 becomes L level. Also, since both node 5a-1 and 5a-4 are L level, the output φ$_{E-2}$ of NOR gate 431-2 becomes H level. The first-stage and second-stage latch circuits are then held in this condition. Furthermore, when the phase comparison result signal φ$_{SO}$ is made H level by subsequent phase comparison, by an identical action, node 5a-3 and 5a-6 both become L level, and the delay control signal φ$_{E-3}$ becomes H level. In this way, delay control signal φ$_E$ is shifted to the right by means of the phase comparison result signals φ$_{SE}$ and φ$_{SO}$, such that the delay time becomes longer.

Contrariwise, by an action opposite to that described above, the delay control signal φ$_E$ is shifted to the left such as to make the delay time shorter by means of phase comparison result signals φ$_{RE}$ and φ$_{RO}$. As will be clear from the operation of the output unit of the phase comparison circuit described above, the phase comparison result signals φ$_{SE}$ and φ$_{SO}$ are generated alternately every time a phase comparison is effected when variable clock d-i-clk is leading, and phase comparison result signals φ$_{RE}$ and φ$_{RO}$ are generated alternately every time a phase comparison is effected when variable clock d-i-clk is lagging.

Also, in response to the phase comparison result signals φ$_{SE}$ and φ$_{SO}$, the delay control signal φ$_E$ shifts successively rightwards until finally delay control signal φ$_{E-32}$ becomes H level. In this condition, the output of inverter 433-32 is latched at L level and the output of NAND gate 432-32 is latched at H level. Thereupon, when, further, a comparison result signal φ$_{SO}$ extending the delay time is supplied, the output of NAND gate 432-43 is pulled down to L level, and the output of inverter 433-32 is pulled up to H level.

As described above, the delay control circuit 21 has no circuit constituent elements that affect lock-on action of the DLL circuit by power source noise and/or back bias voltage noise.

A brief description of the constituent elements of the DLL circuit has been given above. From these descriptions, it can be understood that, in a DLL circuit according to the embodiments of the present invention described below, effects due to power source noise etc. can be suppressed.

[First embodiment]

Figure 8:
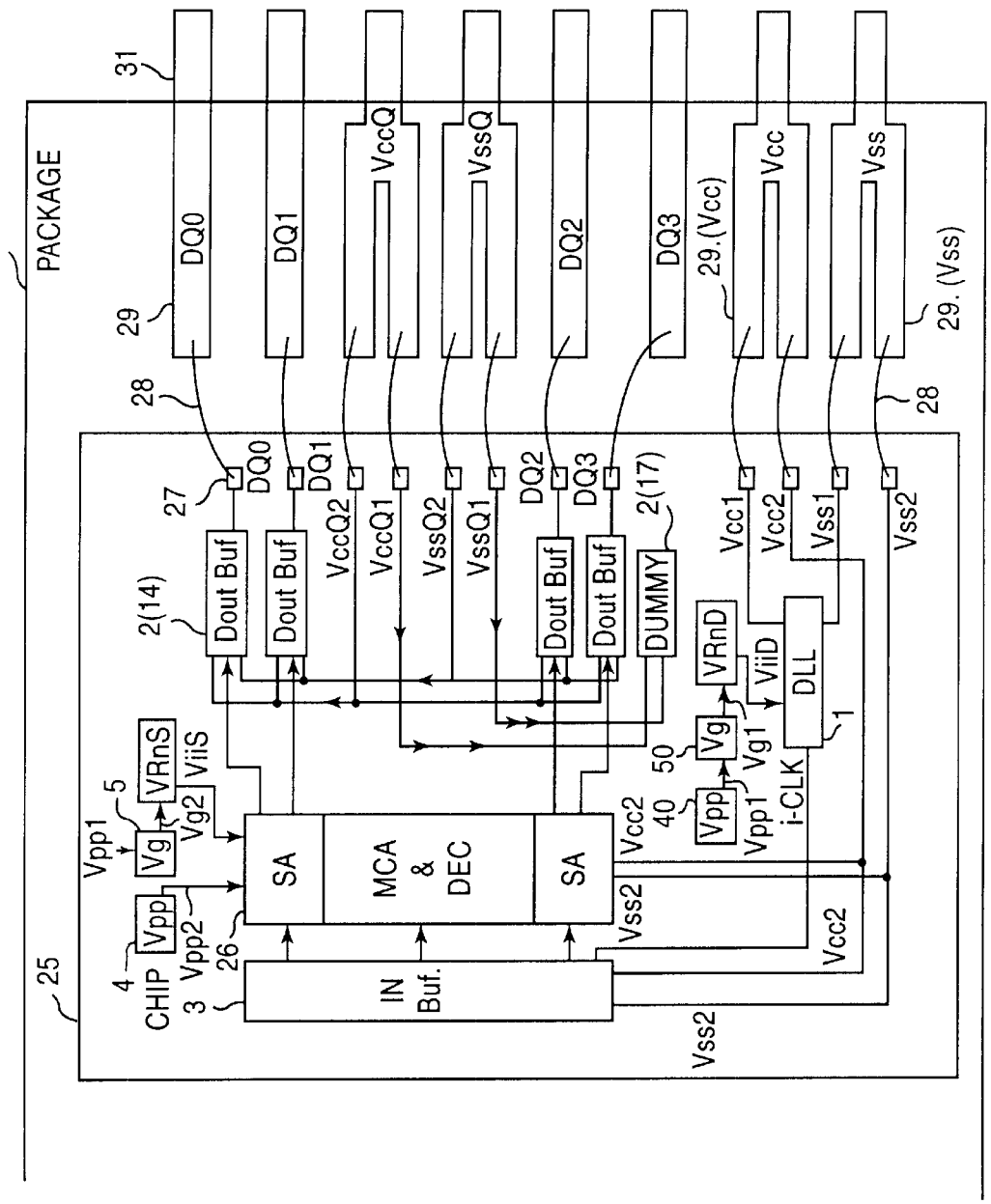
FIG. 8 is a layout diagram of an integrated circuit device according to a first embodiment.

FIG. 8 is a layout diagram of an integrated circuit device according to a first embodiment of the present invention. The integrated circuit device shown in FIG. 8 is constituted by a semiconductor chip 25 within which the integrated circuit is provided and a package 30 in which this semiconductor chip 25 is mounted. Within package 30, external terminal 31 is connected to chip pad 27 in chip 25 through package lead 29 and bonding wire 28. Semiconductor chip 25, as an example, is provided with a memory circuit 26 in addition to the DLL circuit 1. Memory circuit 26 comprises for example a decoder DEC and memory cell array MCA and sense amplifier SA. Also, within the chip, as in the prior art example, in addition to DLL circuit 1, there are provided an input buffer 3 and output buffers 2.

In the embodiment of FIG. 8, there are separately provided first external power sources Vcc1 and Vss1 that are supplied to the DLL circuit as external power sources within the chip, and second external power sources Vcc2, Vss2 that are supplied to circuits other than the DLL circuit. In the example of FIG. 8, these external power sources Vcc, Vss share a common external terminal of package 30 but, within package 30, their external terminals constitute branched package leads 29. An external power source is supplied to the first external power source pads Vcc1, Vss1 and second external power source pads Vcc2, Vss2 within the chip through separate bonding wires 28 from the respective branched package leads 29. The first and second external power sources may be separately constituted from the external terminal 31 of package 30. The first external power sources Vcc1, Vss1 are supplied to the DLL circuit 1 within the chip. Also, the second external power sources Vcc2, Vss2 are supplied to circuits 3, 26 other than the DLL circuit within the chip. Also, as will be described, the second external power sources Vcc2, Vss2 are also supplied to a part of DLL circuit 1.

With such a construction, even if, as a result of generating an action whereby large current is driven within memory circuit 26, power source noise is generated in second external power sources Vcc2, little power source noise is propagated to the first external power sources Vcc1, Vss1, since these are isolated therefrom. Consequently, power source noise generated from circuits other than the DLL circuit cannot have an adverse effect on operation of the variable delay circuit and/or phase comparison circuit within the DLL circuit.

In the prior art example also, the external power source for the output buffer is isolated from the external power source for the internal circuitry, so that the power source noise generated from the output buffer when this needs to drive a large current should not affect the external power source for the internal circuitry. In the embodiment of FIG. 8, in addition, the external power sources VccQ, VssQ in output buffers 2 are separated into first output external power sources VccQ1, VssQ1 which is supplied to the dummy output buffer 17 connected to DLL circuit 1 and second output external power sources VccQ2, VssQ2 that is supplied to the ordinary output buffer 14. In this output external power source separation also, in the same way as described above, branching is effected by package leads 29 within package 30 and connection is effected through bonding wires 28 with respective power sources VccQ1, VssQ1 and VccQ2, VssQ2.

By adopting such a construction, power source noise generated with operation of the ordinary output buffer 14 is prevented from influencing the amount of delay of the dummy output buffer 17 constituting the DLL circuit feedback loop. Consequently, occurrence of jitter in the control clock as in the prior art example can be prevented.

[Second embodiment]

Figure 9:
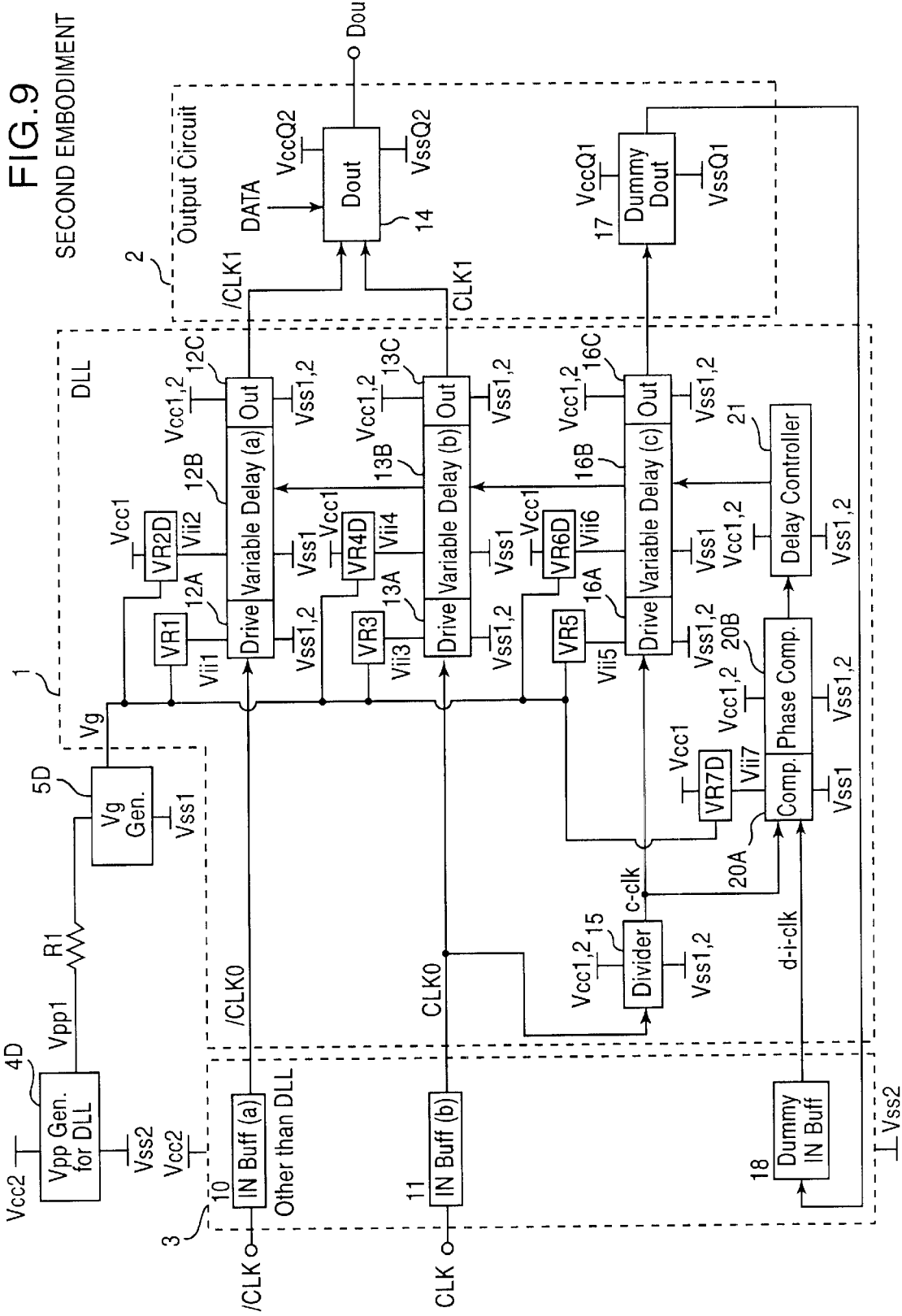
FIG. 9 is a view showing a DLL circuit according to a second embodiment.

FIG. 9 is a view showing a second embodiment of a DLL circuit. The variable delay circuits 12, 13, 16 of the DLL circuit 1 shown in FIG. 9 are divided into driver units 12A, 13A, 16A whereby respective input clocks are supplied, delay units 12B, 13B, 16B through which the clocks driven by the driver units pass, and output units 12C, 13C, 16C that output these delayed clocks. To the respective variable delay units 12C, 13C, 16C, there are supplied internal power sources Vii2, Vii4, Vii6 from a first internal power source circuit VRnD (n is integer) to which control voltage (gate voltage) Vg and first external power sources Vcc1, Vss1 are supplied. Internal power source Vii has a potential level which is generated based on the gate voltage Vg. As shown in FIG. 9, first internal power source circuits VR2D, VR4D, VR6D supply the internal power source Vii2, Vii4, Vii6 to respective variable delay units 12C, 13C, 16C. Also, variable delay units 12C, 13C, 16C are respectively supplied with first external earthing power source Vss1.

Furthermore, variable delay circuit driver units 12A, 13A, 16A are supplied with internal power sources Vii1, Vii3, Vii5 from internal power source circuits VR1, VR3, VR5 that are separate from first internal power source circuit VRnD. To these internal power source circuits VR1, VR3, VR5, as will be described, first external power sources Vcc1, Vss1 or second external power sources Vcc2, Vss2 are supplied, so that internal power source Vii which is based on gate voltage Vg is generated. Furthermore, to the driver section, first external earthing power source Vss1 or second external earthing power source Vss2 is supplied. Two driver sections 12A, 13A, 16A and the internal power source circuits VR1, VR3, VR5 corresponding thereto, as described above, first external power sources Vcc1, Vss1 or second external power sources Vcc2, Vss2 are supplied. However, since power source noise is generated in the driver section when comparatively large current drive action is performed, preferably, second external power sources Vcc2, Vss2 are supplied to these drive section and internal power source circuits VR1, VR3, VR5.

Internal power source Vii has a potential level that is stepped down from external power source Vcc. Such an internal power source Vii is normally utilized with a memory circuit part of larger scale within the chip. By employing a stepped-down potential level, power consumption within the memory circuit is reduced and such lower potential level matches to the voltage-withstand characteristic of for example miniaturized transistors etc. In the example of FIG. 9, this stepped-down internal power source Vii is utilized for variable delay circuits 12, 13, 16 and/or phase comparison circuit 20.

As described above, in the case of DLL circuit 1, to the delay units 12B, 13B, 16B within the variable delay circuit which need to have highest accuracy of the delay time, and to delay element 20A of the phase comparison unit that determines the lock-on detection accuracy in phase comparison circuit 20, there are respectively separately supplied the most stable internal power sources Vii2, Vii4, Vii6, Vii7, from internal power source circuits VR2D, VR4D, VR6D and VR7D, respectively. Thus, to these internal power source circuits VRnD, there are supplied first external power sources Vcc1, Vss1, and to the delay element 20A of the phase comparison unit and the delay units 12B, 13B, 16B, there is supplied first external earthing power source Vss1. The delay element 20A of the phase coincidence detection unit and/or variable delay units 12B, 13B, 16B are therefore little affected by power source noise generated by second external power sources Vcc2, Vss2 that are supplied to circuit 3 other than the DLL circuit 1.

Furthermore, the clocks /CLK0, CLK0 that are supplied to variable delay circuits 12 and 13 are of higher frequency than clock c-clk that is supplied to variable delay circuit 16. The current supply capability of internal power source circuits VRnD that supply internal power source Vii to these is therefore set in accordance with the power consumption of the corresponding variable delay circuits. More specifically, the current supply capability of the internal power source circuits VRnD is set in proportion to the power consumption of the variable delay circuits. Likewise, the current supply capability of the internal power source circuit VR7D that supplies internal power source Vii7 to delay element (phase coincidence detection unit) 20A of the comparison unit within the phase comparison circuit is set in accordance with the power consumption of delay element 20A. The current supply capabilities are described later with reference to specific circuits.

In the embodiment of FIG. 9, first external power sources Vcc1, Vss1 or second external power sources Vcc2, Vss2 are supplied to frequency divider 15, which is a circuit other than the delay units etc. within the DLL circuit 1, output units 12C, 13C, 16C of the variable delay circuits, circuit 20B apart from delay element 20A within the comparison unit of the phase comparison circuit, and to delay control circuit 21. In contrast, second external power sources Vcc2, vss2 are supplied to circuit 3 other than the DLL circuit 1. Transmission of the power source noise generated by operation accompanying large current drive in circuit 3 to first external power sources Vcc1, Vss1 is prevented, and the delay characteristics of DLL circuit 1 are prevented from being affected. In FIG. 9, where Vcc1,2 and Vss1,2 are indicated, this indicates that either of first external power source Vcc1, Vss1 or second external power source Vcc2, Vss2 is supplied. The same convention is adopted in the description below.

In the embodiment of FIG. 9, second external power sources Vcc2 and Vss2 are supplied to boosted power source generating circuit 4D. As will be described, boosted power source generating circuit 4D generates a boosted power source Vpp by performing a charge pumping action on a capacitative element. This in itself therefore makes it liable to become a source of generation of power source noise. Propagation of power source noise to first external power sources Vcc1, Vss1 is therefore prevented by supplying second external power sources Vcc2, Vss2 to this voltage boosted power source generating circuit 4D. Also, the boosted power source Vpp is supplied through low-pass filter R1 as power source to gate voltage generating circuit 5D. As will be described, gate power source generating circuit 5D is supplied with first external earthing power source Vss1, so that it generates a stable gate voltage Vg which is not subject to the effect of power source noise. This gate voltage Vg is supplied to respective internal power source circuits VRnD, VRn. It should be noted that the symbol n of the internal power source circuits indicates an integer. The same convention is adopted hereinbelow.

In the embodiment of FIG. 9, first external power sources Vcc1, Vss1 or second external power sources Vcc2, Vss2 are supplied to the output units 12C, 13C, 16C of variable delay circuits 12, 13, 16. These output units supply phase-regulated control clocks /CLK1, CLK1 to output buffer 14, and so are driven by an external power source. Thereby, since the control clock has the external power source level, level matching with the output buffer 14 that is likewise driven by external power sources VccQ, VssQ can be achieved.

Figure 10:
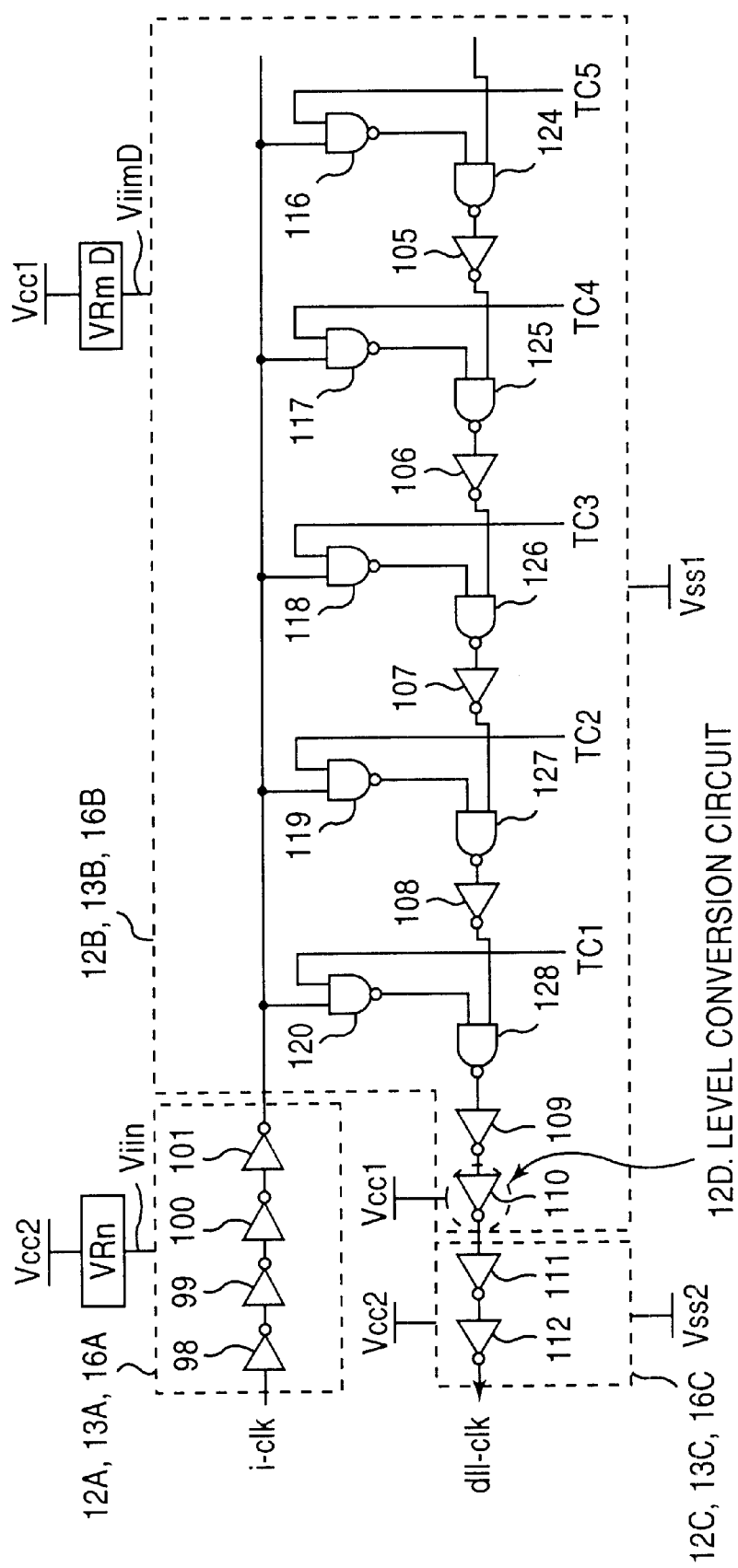
FIG. 10 is a detail circuit diagram of variable delay circuits 12, 13, 16 according to a second embodiment.

FIG. 10 is a detail circuit diagram of variable delay circuits 12, 13, 16 according to a second embodiment. FIG. 10 shows part of the variable delay circuit of FIG. 2.

As described above, in this embodiment, internal power source circuits VRmD are respectively independently provided in variable delay units 12B, 13B, 16B in the variable delay circuit. Consequently, although their action is different since variable delay units 12B, 13B, 16B are supplied with a different clock, since they cannot be affected by the respectively generated power source noise, they can maintain precise delay amounts, making it possible to achieve precise phase regulation.

Furthermore, it can be made possible to make the transmission of power source noise from the drive unit and output units to the variable delay units more difficult by separating the power source of the variable delay units, which are subjected to comparatively little charging/discharging of current, and the power sources of the drive unit and output units, which are subjected to comparatively more charging/discharging.

In the second embodiment, as shown in FIG. 10, second external power sources Vcc2, Vss2 are supplied to inverters 112, 111 constituting an output unit 12C. Also, between output unit 12C and delay unit 12B, there is provided a level conversion circuit 110 which converts the clock signal from stepped-down internal power source Vii to external power source Vcc2. This level conversion circuit 110 does not have a large current drive capability like output unit 12C but rather supplies first external power sources Vcc1, Vss1, so as to raise the accuracy of their delay characteristics. To the inverters 98 to 101 constituting driver unit 12A, internal power source Vii is supplied from internal power source circuit VRn which is supplied with second external power source Vcc2, and second external earthing power source Vss2 is supplied. Delay unit 12B is thereby prevented from being influenced by power source noise produced by drive action of driver unit 12A.

In the embodiment shown in FIG. 9, in the output circuit 2, as described above, second output external power sources VccQ2, VssQ2 are supplied to ordinary output buffers 14 and first output external power sources VccQ1, VssQ1 are supplied to the dummy output buffer 17 constituting the feed back loop of the DLL circuit; thus its delay characteristics of the dummy output buffer 17 are prevented from being influenced by power source noise.

[Third embodiment]

Figure 11:
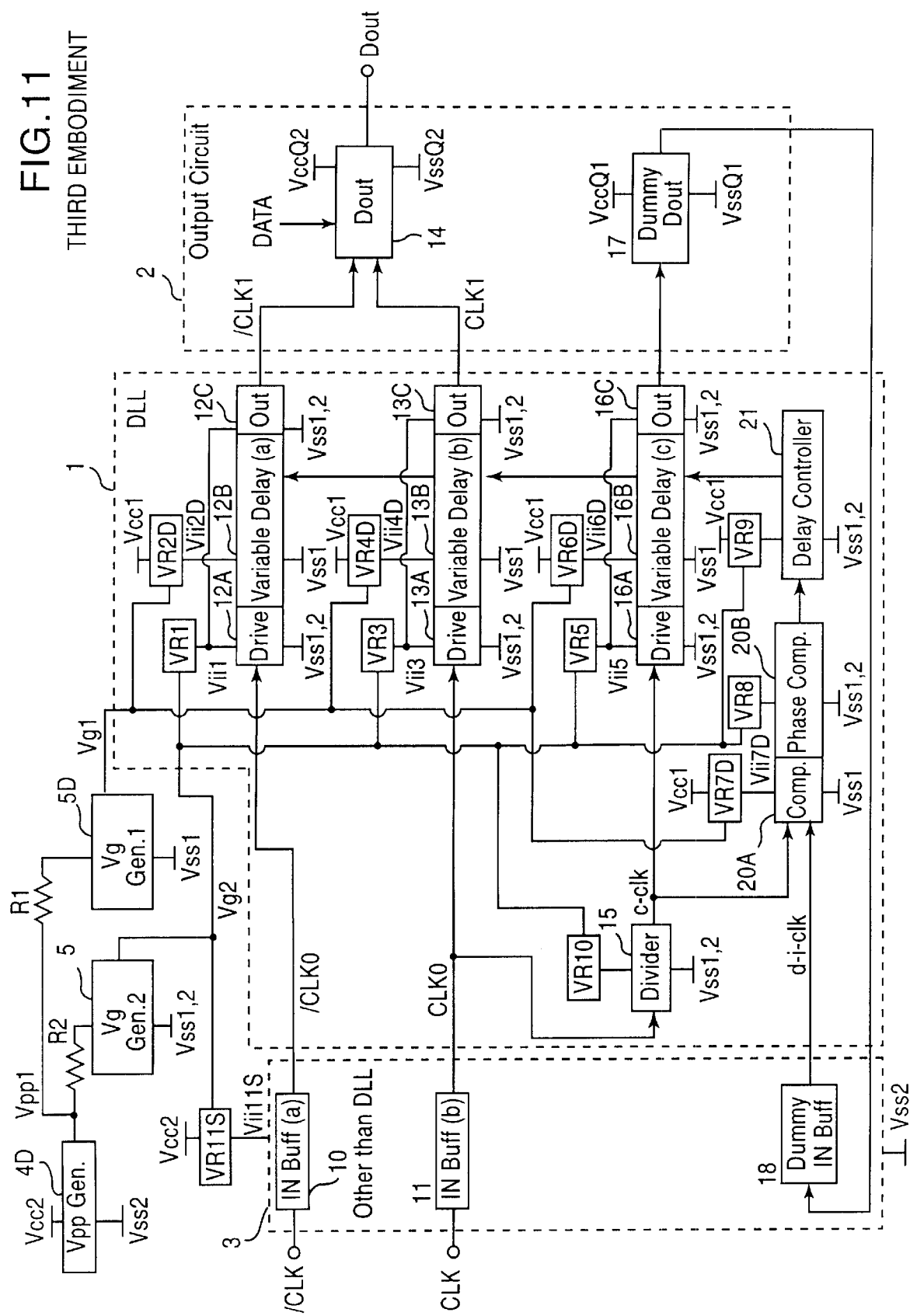
FIG. 11 is a view showing a DLL circuit according to a third embodiment.

FIG. 11 is a view showing a DLL circuit according to a third embodiment. The third embodiment is an example in which an internal power source Vii11S that is stepped down in voltage from the external power source is utilized also for input buffer 3, which is a circuit other than the DLL circuit 1. An internal power source Vii which is stepped down in voltage is employed for a memory circuit constituting a circuit other than the DLL circuit in FIG. 11, as shown in FIG. 8.

In the embodiment of FIG. 11, an internal power source circuit VR11S is provided in order to supply internal power source to an input buffer 3 other than the DLL circuit. Internal power source circuit VRiiS is supplied with second external power source Vcc2 and generates internal power source Vii11S in accordance with gate voltage Vg2. Circuits such as input buffer 3 other than the DLL circuit are unstable in operation and their operation may be accompanied by large current drive. Consequently, this may cause generation of unstable large currents in internal power source Vii11S which may constitute a source of generation of noise on gate voltage Vg2. Accordingly, in the third embodiment, gate voltage generating circuit 5 that supplies gate voltage Vg2 to internal power source circuit VR11S used by circuits other than the DLL circuits is separately provided from the gate voltage generating circuit 5D of the internal power source circuit VRnD for the DLL that supplies internal power source to variable delay units 12B, 13B, 16B of DLL circuit 1 and comparison unit 20A having a delay element within the phase comparison circuit. Consequently, even if noise is transmitted to gate voltage Vg2, it is difficult for this noise to be transmitted to the gate voltage Vg1 for the DLL. As a result, stabilized gate voltage Vg1 is supplied to internal power source circuit VRnD for the DLL, and the voltage of the internal power source ViinD for the DLL is also stable.

In the embodiment of FIG. 11, further internal power source circuits VRn that gate voltage Vg2 is supplied to and generate internal power source Viin are respectively provided to circuits other than comparison unit 20A having a delay element and variable delay units 12B, 13B, and 16B within DLL circuit 1. As will be described, this internal power source circuit VRn is supplied with first external power source Vcc1 or second external power source Vcc2. In this way, by providing an internal power source circuit VRn separately from the internal power source circuit VRnD for the most critical parts which are the comparison unit having delay elements and the variable delay units, internal power source Viin is generated separately from the internal power source ViinD that is supplied to the critical parts, so transmission of power source noise thereto is avoided. Furthermore, by supplying gate voltage Vg2 that is supplied to internal power source circuit VRn generating internal power source Viin from a gate voltage generating circuit 5 separate from the gate voltage generating circuit 5D for the DLL, transmission of power source noise through the gate voltage Vg1 to the internal power source circuit VRnD for the DLL is prevented. This is the same as the second embodiment illustrated in FIG. 9 in regard to the external earthing power sources Vss1, Vss2.

[Fourth Embodiment]

Figure 12:
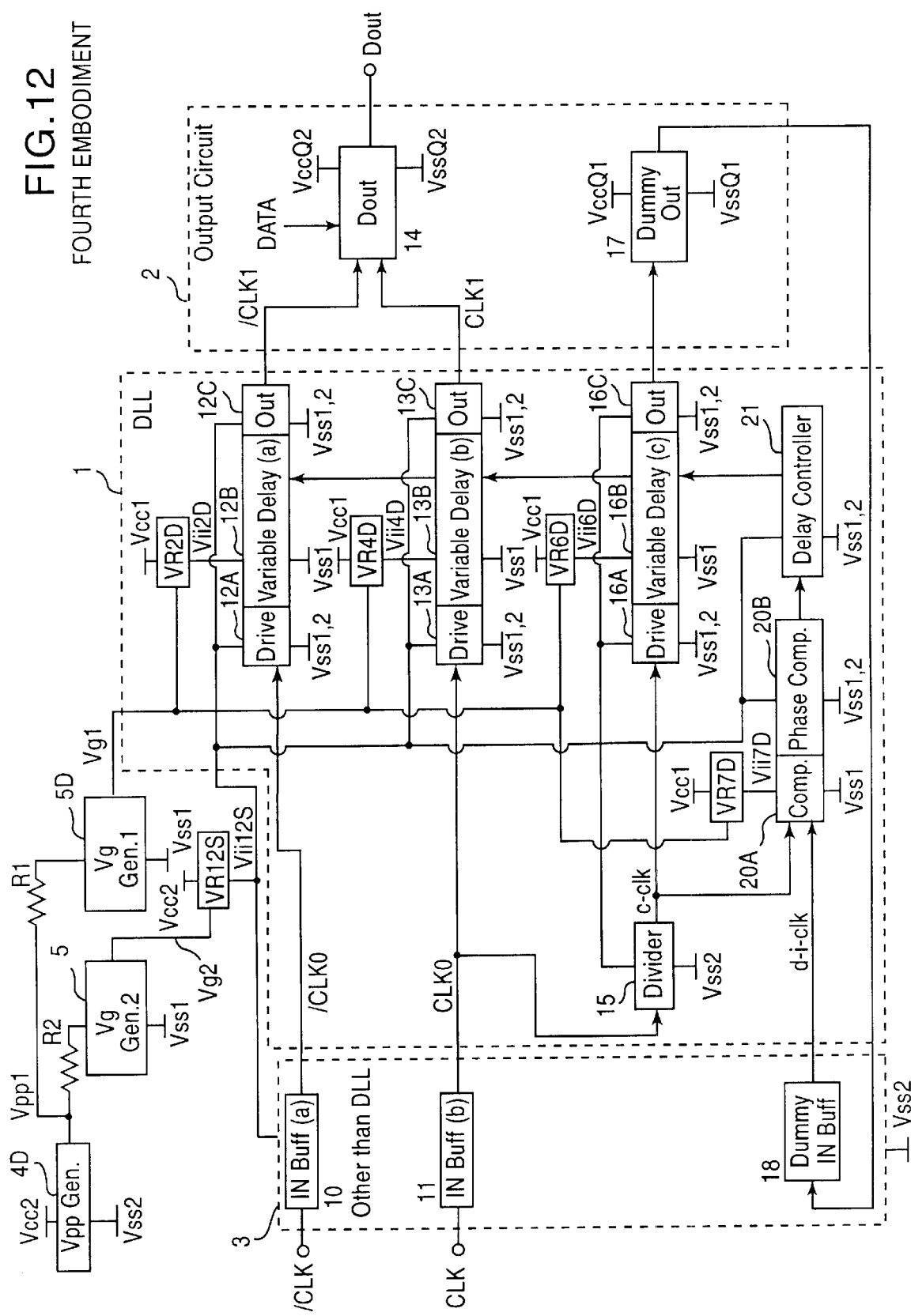
FIG. 12 is a view showing a DLL circuit according to a fourth embodiment.

FIG. 12 is a diagram showing a DLL circuit according to a fourth embodiment. The fourth embodiment also is an example in which, like the third embodiment, an internal power source Vii12S that is stepped down from the external power source is utilized for input buffer 3 also, which is a circuit other than the DLL circuit. The case where an internal power source Vii that is stepped down in voltage is utilized by a memory circuit, constituting a circuit other than the DLL circuit, as shown in FIG. 8, is also the same as that of FIG. 12.

In the embodiment of FIG. 12, in the same way as the third embodiment, in addition to the internal power source circuit VRnD that supplies internal power source ViinD to the comparison unit (phase coincidence detection unit) 20A having a delay element within the phase comparison circuit and variable delay units 12B, 13B, 16B within the DLL circuit 1, there is separately provided an internal power source circuit VR12S for circuits other than these. Thus, there are separately provided gate voltage generating circuits 5D, 5 that supply respective gate voltages Vg1, Vg2 to internal power source circuits VRnD for the DLL and an internal power source circuit VR12S for circuits other than this. By this means, transmission of power source noise from the operation of circuits other than the DLL circuit to the internal power source ViinD for the DLL through the gate voltage wiring is prevented.

In the example of FIG. 12, internal power source circuit VR12S supplies internal power source Vii12S to the circuits other than the delay units 12B, 13B, 16B and the comparison unit 20A within the DLL circuit, so the number of internal power source circuits other than the internal power source circuit VRnD for the DLL can be reduced. Such a construction of the internal power source circuits in FIG. 12 is possible since these circuits have no fluctuation of delay characteristic produced by power source noise, compared with the delay units and comparison unit.

First external earthing power source Vss1 is supplied to the comparison unit and delay units just as in the case of the second and third embodiments; first external earthing power source Vss1 or second external earthing power source Vss2 is supplied to the circuits other than these circuits. However, preferably, the second external earthing power source Vss2 is supplied to the circuits other than the delay units and comparison unit. In this way, transmission of power source noise generated in second external earthing power source Vss2 to first external earthing power source Vss1 can be made difficult.

Figure 13:
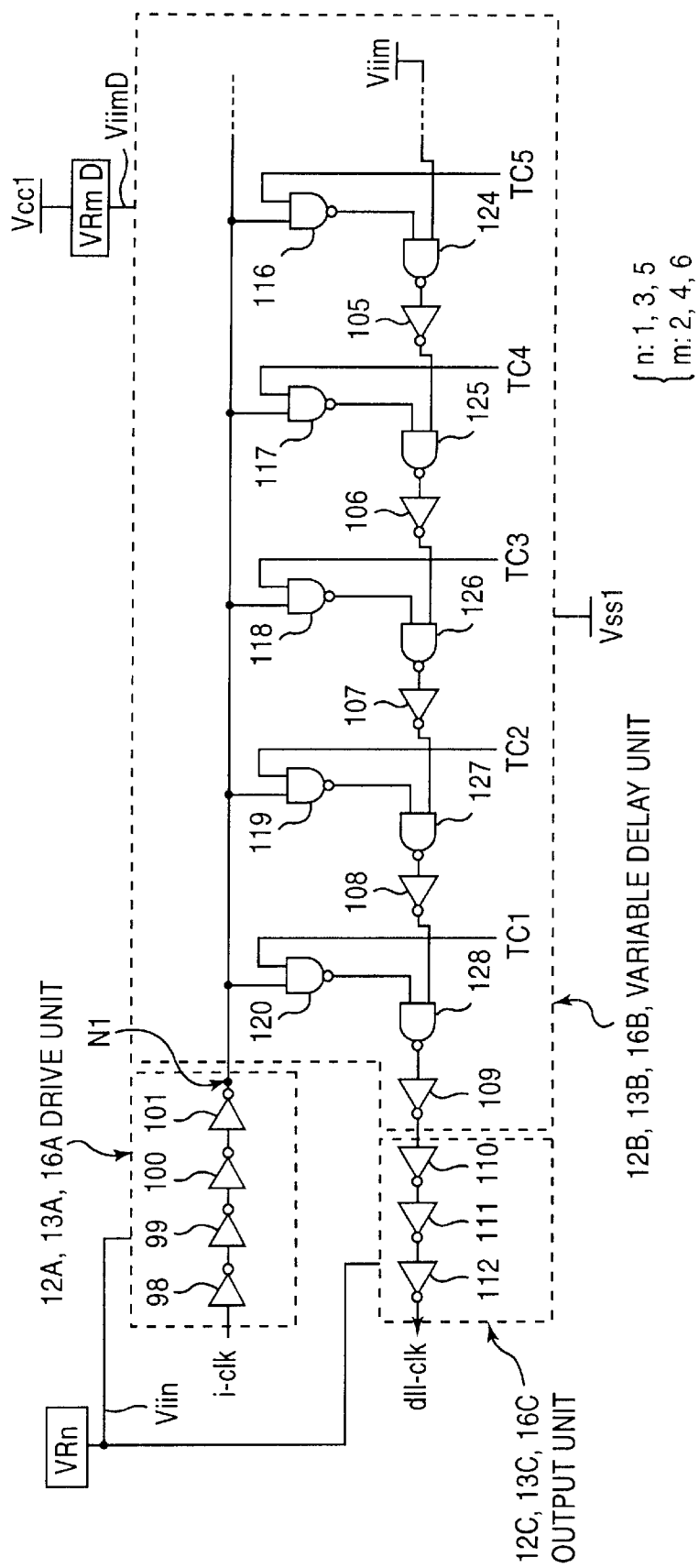
FIG. 13 is a layout diagram of variable delay circuits 12, 13, 16 in the third and fourth embodiments.

FIG. 13 is a layout diagram of variable delay circuits 12, 13 and 16 according to a third and fourth embodiment. In this example also, in the same way as in the example of FIG. 10, internal power source circuits VRmD for the DLL intended exclusively for the DLL circuit are independently provided for variable delay unit 12B, and internal power source ViimD is supplied respectively thereto. First external power sources Vcc1, Vss1 are supplied to internal power source circuit VRmD for the DLL and to variable delay unit 12B, so that power source noise from other circuits is cut off. Furthermore, by providing internal power sources for the DLL for respective delay units, even in cases where their operation is different due to the clock frequencies supplied to the respective delay units being different, there is no possibility of their power source noises affecting each other through the internal power source ViimD.

Also, in the third and fourth embodiments, stepped-down internal power source Viin is supplied also to drive unit 12A and output unit 12C of the variable delay circuit, but internal power source is supplied to these collectively from internal power source circuit VRn. In the case of the fourth embodiment, this internal power source circuit is constituted by circuit VR12S that utilizes second external power source Vcc2.

Returning to FIG. 3, the layout of the comparison unit of the phase comparison circuit of the second to fourth embodiments will be described. As described above, the power sources are divided into that for gate 201 and 215, which are delay elements that determine the lock-on detection sensitivity, and that for portions other than these. Internal power source Vii7D that is stepped down by internal power source circuit VR7D is supplied to these delay elements 201, 215, while power from another power source is supplied to the other gates. As in the second embodiment of FIG. 9, when the power of peripheral circuits other than the DLL circuit is not stepped down from the external power source, first external power sources Vcc1, Vss1 or second external power sources Vcc2, Vss2 are supplied to the other gates. When, as in FIG. 11 and FIG. 12, the power source for the peripheral circuitry other than the DLL is stepped down from the external power source, the other gates are supplied with internal power source Vii generated on the basis of gate voltage Vg2 of gate voltage generating circuit for circuits other than the DLL circuit.

FIG. 21 shows an example of the construction of gates 201 and 215 referred to above. As illustrated, internal power source Vii7D from internal power source circuit VR7D is connected to the PMOS transistors constituting gates 201 and 215 and first external earthing power source Vss1 is connected to the NMOS transistors. Since there is little effect due to power source noise on internal power source Vii7D and first external earthing power source Vss1, the delay times of gates 201, 215 show little fluctuation.

As will be clear from the description of the phase comparison circuit, the phase comparison circuit is in lock-on condition when the phase difference of the two input clocks c-clk, d-i-clk are within the delay times of these gates 201, 215. Consequently, the lock-on condition of the phase comparison circuit can be more accurately detected by suppressing fluctuation of the delay time of the gates 201, 215 constituting the delay elements.

Since parts other than gates 201, 215 in the phase comparison circuit only transmit digital signals responsive to the input signal level to subsequent stages, they are not easily affected by power source noise. Consequently, power source countermeasures as in the case of gate elements 201, 215 are unnecessary and the power source must only be isolated so that the power source noise produced by operation of these gates has no effect on the delay elements.

[Internal power source system]

As shown in FIG. 8, it is desirable that the power source systems 4D, 5D, VRnD that generate internal power source ViiD for the DLL should be separately provided from the power source systems 5, VRnS that generate internal power source ViiS for circuits other than the DLL circuit, such as memory. It is further desirable that the second boosted power source generating circuit 4 that generates the boosted power source Vpp2 employed by memory etc. other than the DLL circuit should be separately provided from the first boosted power source generating circuit 4D that generates boosted power source Vpp1 for the DLL. Accordingly, embodiments of the present invention will be described by describing specific examples of these internal power source systems.

Figure 14:
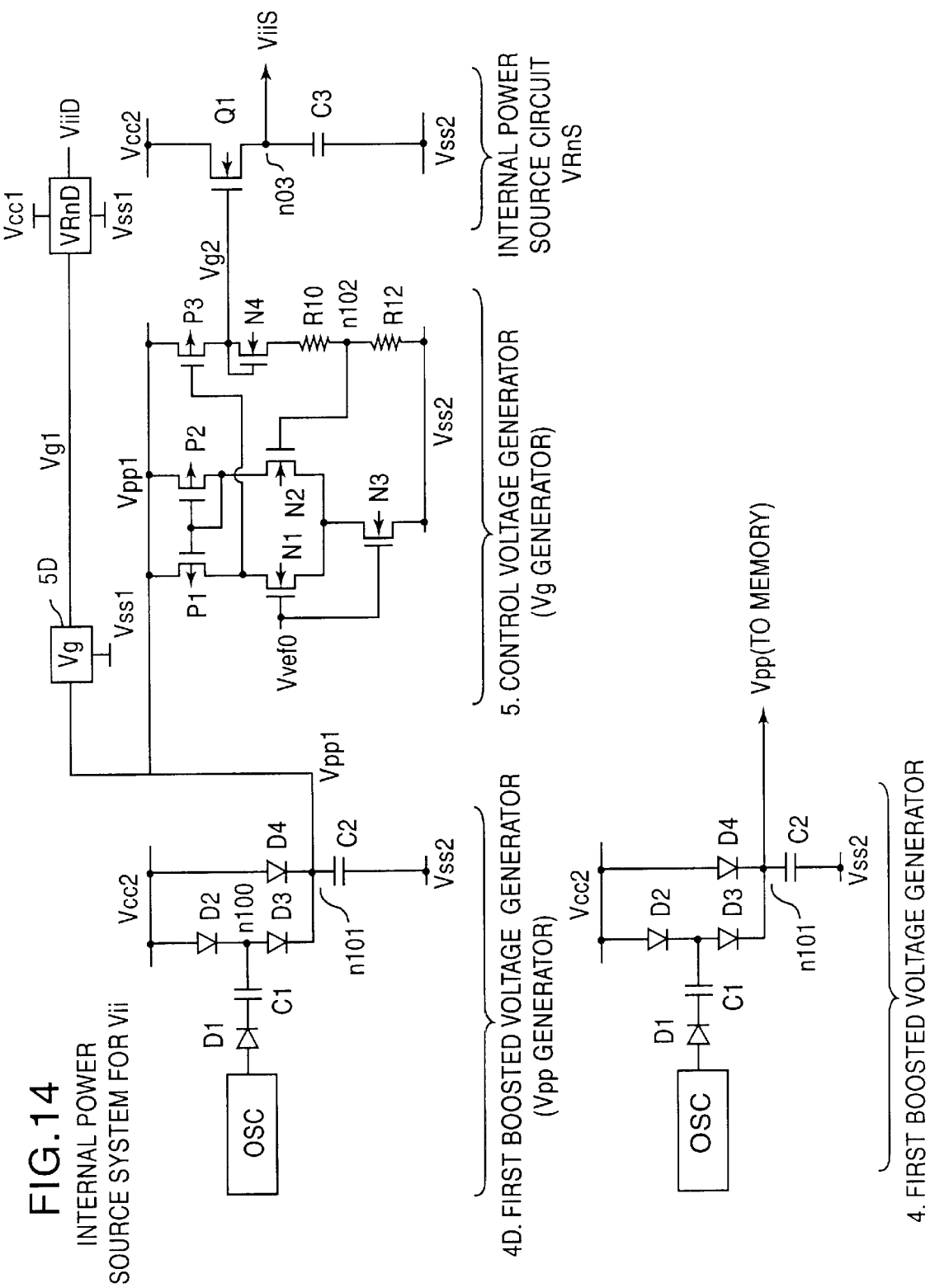
FIG. 14 is a circuit diagram showing the internal power source system illustrated in FIG. 8.

FIG. 14 is a circuit diagram illustrating an internal power source system shown in FIG. 8. The internal power source system comprises: a first boosted power source generating circuit 4D for the DLL, first and second gate voltage (control voltage) generating circuits 5D, 5, internal power source circuit VRnD for the DLL, internal power source circuit VRnS for circuits other than the DLL, and a second boosted power source generating circuit 4 that is utilized by memory etc. other than the DLL circuit. Boosted power source generating circuits 4D, 4 are supplied with external power sources Vcc2, Vss2 and respectively generate boosted power sources Vpp1, Vpp2. Gate voltage (control voltage) generating circuits 5D, 5 are supplied with first boosted power source Vpp1 and respectively generate gate voltages (control voltages) Vg1, Vg2 that are higher by a prescribed voltage than the reference voltage Vref. Internal power source circuit VRnS is supplied with second external power sources Vcc2, Vss2 and generates internal power source ViiS that is lower by the amount of the threshold voltage of the transistor Q1 than the gate voltage Vg2. Also, internal power source circuit VRnD for the DLL circuit is supplied with first external power sources Vcc1, Vss1, and generates internal power source ViiD for the DLL circuit that is lower by the amount of the threshold voltage of the transistor therein than the gate voltage Vg1.

Boosted power source generating circuits 4D, 4 are both constituted by a ring oscillator or oscillator OSC, diodes D1 to D4 and capacitors C1 to C2. The capacitors C1, C2 are charged up via the diodes D2, D4 so that the respective nodes n100 and n101 are brought to a potential lower than power source Vcc2 by the amount of the forward voltage of diode D2, D4. Oscillator OsC supplies a pumping pulse to the electrode on the opposite side of capacitor C1 to node n100, thereby causing node n100 to be boosted in voltage through capacitor C1, with the result that boosted voltages Vpp1, Vpp2 higher than external power source Vcc2 are generated at node n101. Second boosted power source Vpp2 is utilized as the word line drive voltage of, typically, memory, which is a circuit other than the DLL circuit. Consequently, first boosted power source Vpp1 is utilized in the control voltage generating circuit 5, 5D that supplies gate voltage Vg1, Vg2 to the internal power source circuit VRnD, VRnS, so the internal power source circuit system is isolated from the second boosted power source Vpp2.

The circuitry of voltage boosted power source generating circuit 4D for the DLL circuit adapted to avoid power source noise will be described later.

Control voltage generating circuit 5 comprises an operational amplifier comprising PMOS transistors P1, P2 and NMOS transistors N1, N2, N3, and a negative feedback circuit comprising a PMOS transistor P3 whereby the drain of transistor N1 is connected to the gate, an NMOS transistor N4, and resistors R10, R12. One input of the operational amplifier is supplied with reference voltage Vref, while the other input is supplied by node n102 of the negative feedback circuit. By the function of the operational amplifier and negative feedback circuit, node n102 is controlled so as to be the same potential as reference voltage Vref. That is, when reference voltage Vref rises, the drain of transistor N1 falls, causing the conductivity of transistor P3 to rise, as a result of which node n102 also rises, until it balances with reference voltage Vref. Gate voltage Vg2 is therefore controlled to a potential obtained by adding the threshold voltage of transistor N4 to a voltage which is (R10+R12)/R12 times the voltage of node n102.

The control voltage generating circuit 5D for the DLL circuit also has the same circuit layout as the above circuit 5. For this circuit 5B also, a circuit adapted to avoid power source noise will be described later.

Internal power source circuit VRnS has an external power source Vcc2 connected to its drain, its gate is supplied with gate voltage Vg2, and has connected to its source a source follower transistor Q1 whereby internal power source ViiS is generated and a capacitor C3 for absorbing fluctuations of this internal power source ViiS. This internal power source circuit VRnS generates an internal power source ViiS lower than gate voltage Vg2 by the amount of the threshold voltage Vth of transistor Q1 (i.e. Vg2−Vth), and the current supply to the circuit to which internal power source ViiS is connected is performed through transistor Q1 from external power source Vcc2. Gate voltage Vg2 is a fixed voltage, so internal power source ViiS is controlled to a fixed voltage which is lowered therefrom by the amount of the threshold voltage of transistor Q1. Capacitor C3 connected to the source of transistor Q1 accumulates charge in order to prevent the potential of internal power source ViiS dropping even if circuit operation temporarily consumes a large current when the circuit whereby internal power source ViiS is supplied recovers from power-down mode.

The internal power source circuit VRnD for the DLL circuit, like the internal power source circuit VRnS referred to above, also has control voltage Vg1 supplied to its gate, first external power source Vcc1 supplied to its drain and is provided at its source with a source follower transistor that generates internal power source ViiD for the DLL. Regarding this circuit also, a circuit adapted to avoid power source noise will be described later.

As shown in FIG. 8, the internal power source system for the DLL comprises a boosted power source generating circuit 4D, a gate voltage generating circuit 5D, and an internal power source circuit VRnD. These circuits are fundamentally constituted by the circuit shown in FIG. 14, but, in order to reduce the effect of power source noise on the DLL circuit, various improvements are applied and will be described below.

Figure 15:
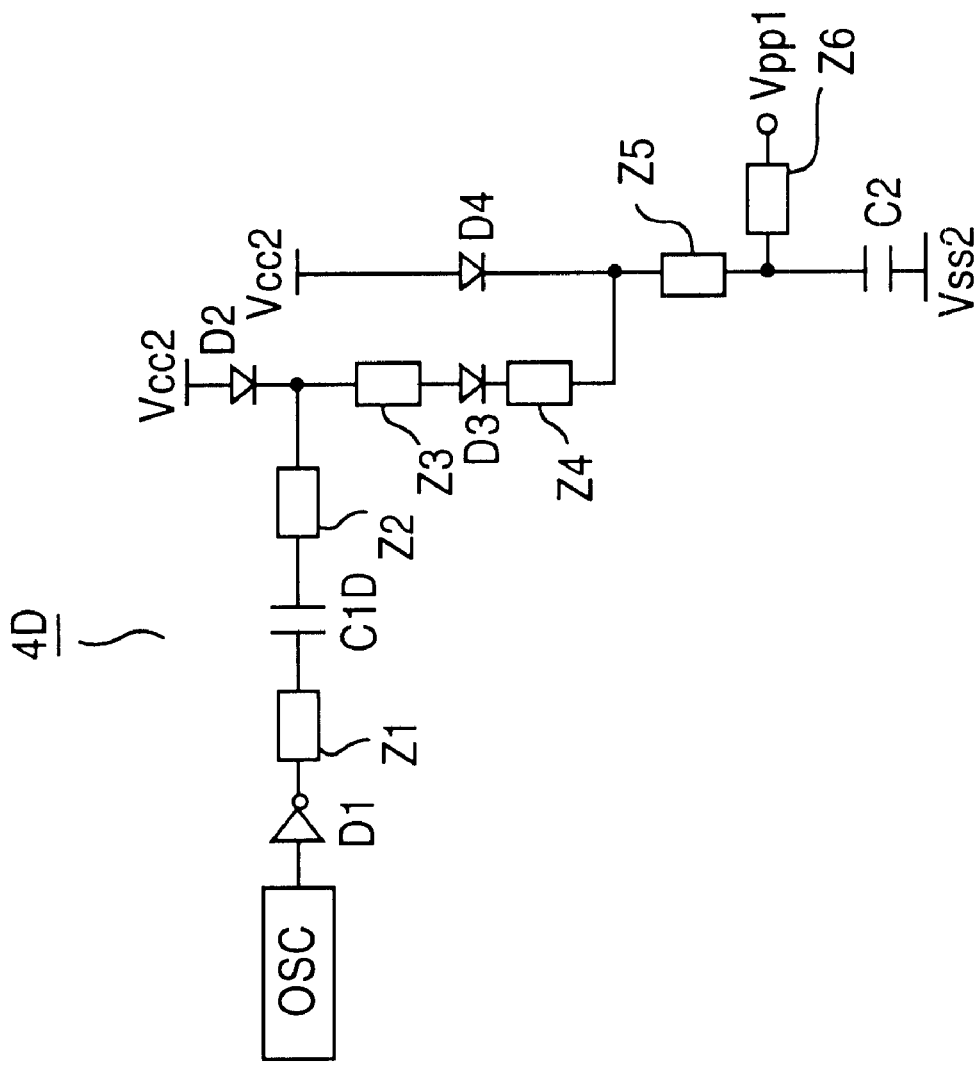
FIG. 15 is a view showing a boosted power source generating circuit for a DLL.

FIG. 15 is a view showing an improved example of the voltage boosted power source generating circuit 4D for the DLL. The boosted power source generating circuit 4D for the DLL also, like the boosted power source generating circuit 4 for circuits other than the DLL shown in FIG. 14, comprises a ring oscillator OSC, voltage boosting capacitor C1D, and diodes D1 to D4, and generates boosted power source Vpp1. The points of difference between the boosted power source generating circuit 4 for circuits other than the DLL of FIG. 14 are that the capacitance of the voltage boosting capacitor C1D within the boosted power source generating circuit 4D of the DLL is smaller than the capacitance C1 of the circuit 4 of FIG. 14, and, as shown in FIG. 15, there is provided one or other of resistive means Z1 to Z6.

When the capacitance of the voltage boosting capacitor C1D is small, the voltage boosting capability is also small, but when voltage boosting operation takes place the power source noise generated in boosted power source Vpp1 by the pumping action can be reduced. The boosted power source Vpp1 that is generated by the boosted power source generating circuit 4D for the DLL is employed solely in order to generate gate voltage Vg1 of internal power source circuits VRnD and VRn etc. It does not therefore need to have such a large voltage boosting capability as boosted power source Vpp2 for generating gate voltage Vg2 of internal power source circuit VRnS for circuits such as memory that consume large current. No particular problems therefore arise even if voltage boosting capacitor C1D is made small. Also, the power source noise to second external power sources Vcc2, Vss2 produced by the voltage boosting action, as described above, cannot easily be transmitted to first external power sources Vcc1, Vss1.

Furthermore, the voltage boosting action of boosted power source generating circuit 4D for the DLL is buffered by a kind of low-pass filter function due to the provision of resistive means Z1 to Z6 therein. As a result, power source noise on the boosted power source Vpp1 can be reduced.

Figure 16:
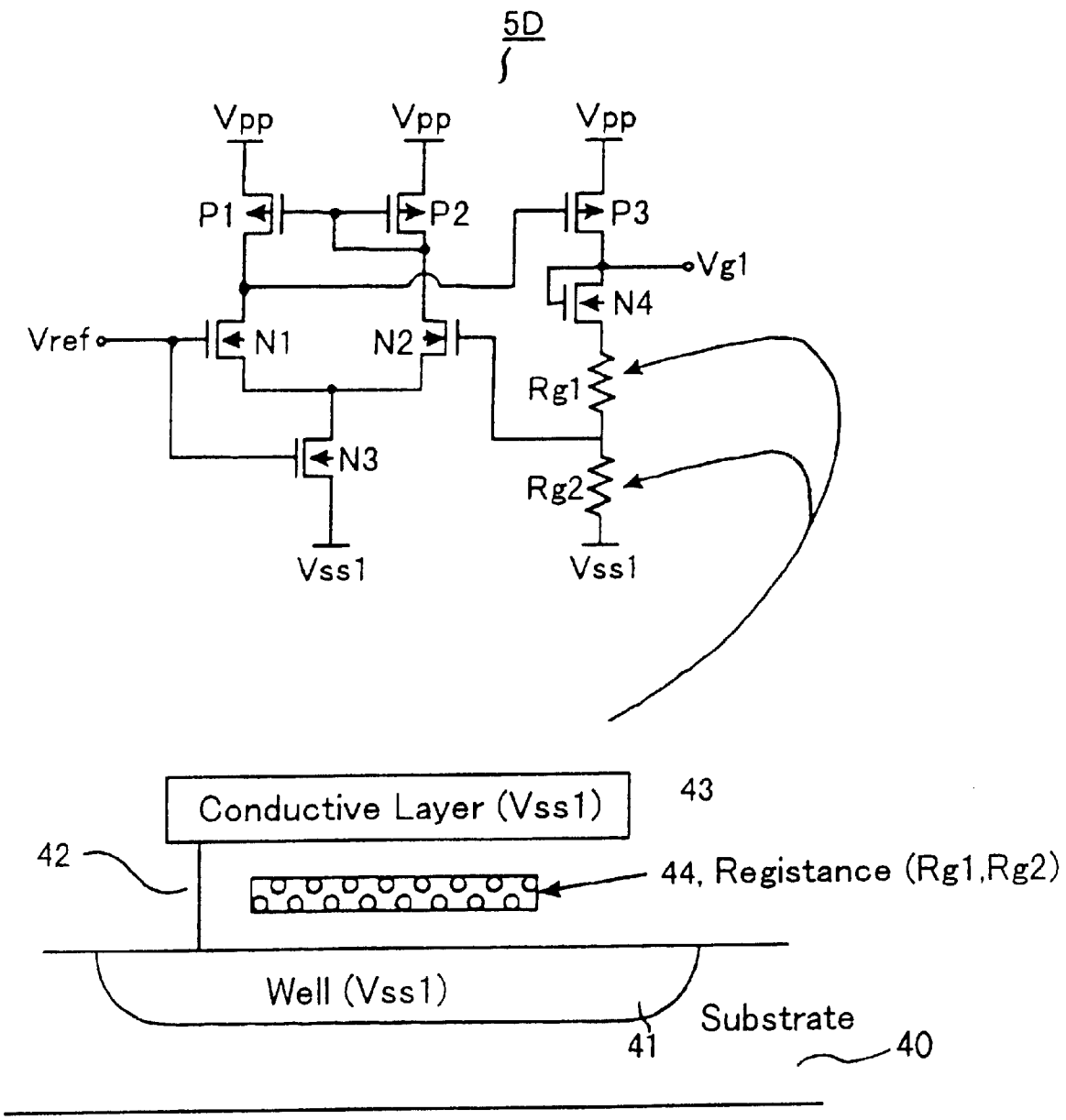
FIG. 16 is a layout diagram of a control voltage generating circuit 5D for a DLL.

FIG. 16 is a layout diagram of control voltage generating circuit 5D for the DLL. This circuit 5D is the same circuit as the control voltage generating circuit 5 shown in FIG. 14. However, a resistance R1 acting as a low-pass filter is provided between boosted power source generating circuit 4D for the DLL and control voltage generating circuit 5D for the DLL. The low-pass filter is constituted by the resistance R1 and stray capacitance. See FIGS. 9, 11 and 12. Also, for the earthing power source of control voltage generating circuit 5D for the DLL, first external earthing power source Vss1 is employed.

Then, noise from other circuits is cut off by arranging in parallel the first external earthing power source Vss1 wiring as shown in the bottom part of the drawings to resistances Rg1, Rg2 that determine the potential of the gate voltage Vg1. And above and below a resistance lead 44 consisting of polysilicon arranged within insulating film 42 provided on the surface of semiconductor substrate 40, there are adjacently provided a conductive layer 43 connected to first external earthing power source Vss1 and a well region 41 likewise connected to power source Vss1. By means of this construction, resistance wiring 44 is shielded by the earthing power source wiring, and so is shielded from noise from other circuits. consequently, change of potential of the resistances Rg1, Rg2 consisting of polysilicon is prevented, and the potential of gate voltage Vg1 can thereby be stabilized.

Figure 17A:
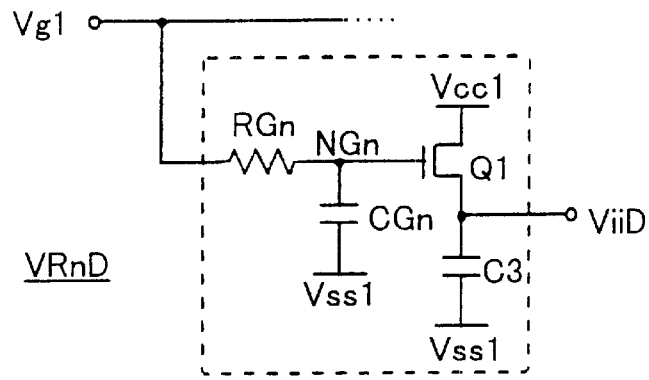
FIG. 17 is a view illustrating an internal power source circuit.
Figure 17B:
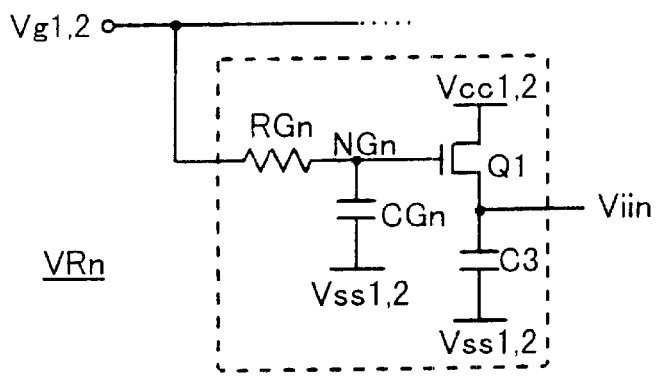
Figure 17C:
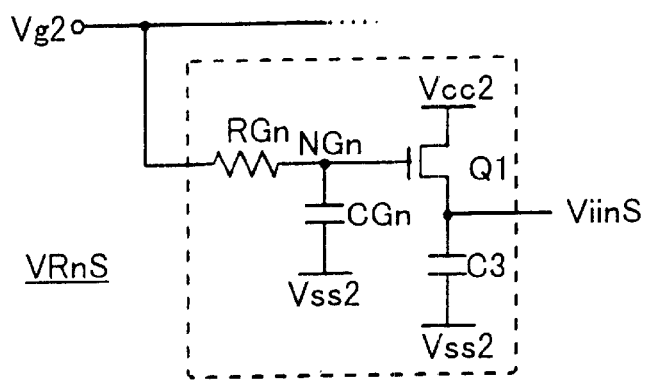

FIG. 17 is a view showing an internal power source circuit. FIG. 17A shows internal power source VRnD for the DLL, FIG. 17B shows internal power source circuit VRn for other circuits within the DLL circuit, and FIG. 17C shows internal power source circuit VRnS for circuits other than the DLL circuit.

The internal power source circuits VRnD for the DLL and internal power source circuits VRn (n=1 to 7) that are utilized in the second and third embodiments of FIG. 9 and 11 are constituted by a transistor Q1 and capacitor C1. Gate voltages vg1, vg2 are then supplied through low-pass filters RGn, CGn to the gates NGn of transistors Q1. The effect of noise generated in gate voltage Vg can thereby be suppressed. For the capacitors CGn of these low-pass filters, the stray capacitance of gate terminals NGn can be utilized.

Furthermore, internal power source circuit VRnD for the DLL is connected to first external power sources Vcc1, Vss1. The effect of power source noise generated in second external power sources Vcc2, Vss2 on the internal power source ViiD is therefore slight. As mentioned above, internal power source circuit VRnD for the DLL supplies a plurality of variable delay units 12B, 13B, 16B and comparison unit 20A. Regarding the power consumption of these circuits, that of variable delay units 12B, 13B is greatest, followed by that of variable delay unit 16B, and that of comparison unit 20A is least. The current supply capability of the internal power source circuits that supply the internal power sources to these circuits is therefore also set such that VR2D=VR4D>VR6D>VR7D.

Specifically, the gate widths of the source follower transistors Q1 are set in the above relationship. If the frequency of the clock that is supplied to variable delay circuits 12, 13 is four times the frequency of the frequency-divided clock supplied to variable delay circuit 16, the gate width of its transistor is also set at 4:1 so that the current supply capability of internal power source circuits VR2D, VR4D and VR6D are in the ratio 4:1.

The internal power source circuit VRnS for the circuits other than the DLL circuit is connected to second external power sources Vcc2, Vss2. The construction whereby gate voltage Vg2 is supplied to the gate of transistor Q1 through the low-pass filter is the same as described above. The gate width of this transistor Q1 is also set in correspondence with the power consumption of the circuit whereby internal power source ViinS is supplied. The gate width of transistor Q1 of internal power source circuit VR12S of the fourth embodiment of FIG. 12 is therefore set comparatively wide.

FIG. 18 is a view showing a further example of an internal power source circuit for the DLL. The internal power source circuit for the DLL shown in FIG. 17A is constituted by a transistor Q1 controlled by a gate to which is supplied gate voltage Vg, and a capacitor C3 on which charge is accumulated during power-down. At the source of transistor Q1, internal power source ViinD is generated, and this is supplied to the DLL circuit.

Figure 19A:
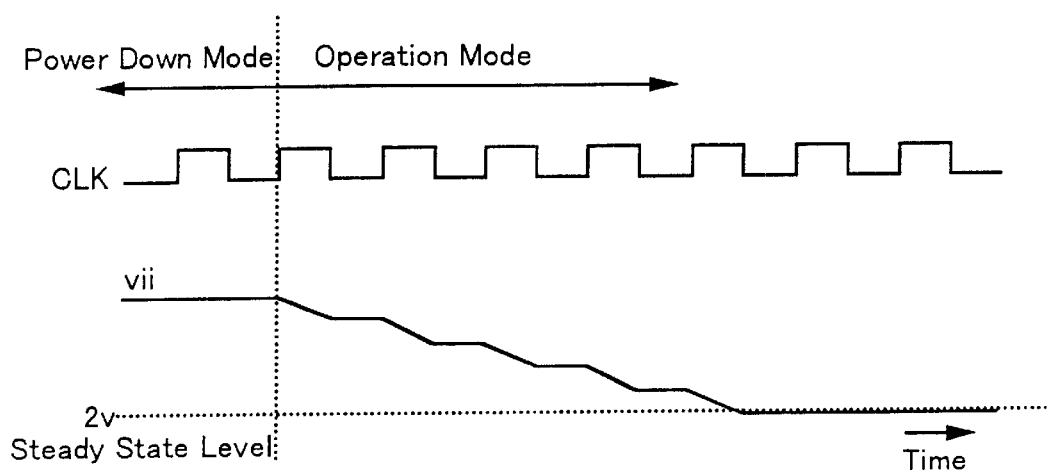
FIG. 19 is a waveform diagram showing the operation of FIG. 18.

In some DLL circuits, in the active state, the clock is supplied and the internal circuitry is operated but, during power-down, the clock is not supplied and operation is stopped. In the active condition, the DLL circuit consumes current and its source potential is maintained stably at a potential lower than the gate voltage Vg by the amount of the threshold voltage. During power-down, the current consumption of the DLL circuit is zero, so the source potential rises in a floating condition and transistor Q1 is operated in the sub-threshold region. In the sub-threshold region, a leakage current is generated until the potential between the gate and the source of transistor Q1 becomes sufficiently lower than the threshold voltage. The leakage current resulting from this operation in the sub-threshold region is accumulated on capacitor C3, so that, even if, on recover from power-down, the DLL circuit is suddenly actuated, consuming a large current, the potential of the internal power source ViinD falls only slowly. When the change of internal power source Vii on recovery from actual power-down is investigated, as shown in FIG. 19A, it is found that the level of the internal power source Vii on power-down rises too much, and about five clock cycles are required before the internal power source Vii can recover to the steady-state level of 2V on return to ordinary operating mode. After reaching the active condition, the DLL circuit requires dummy cycles before it displays the desired characteristic. Desirably the number of these dummy cycles is as few as possible, but in the example of FIG. 19A the number of these dummy cycles is as large as five clock cycles.

Figure 18A:
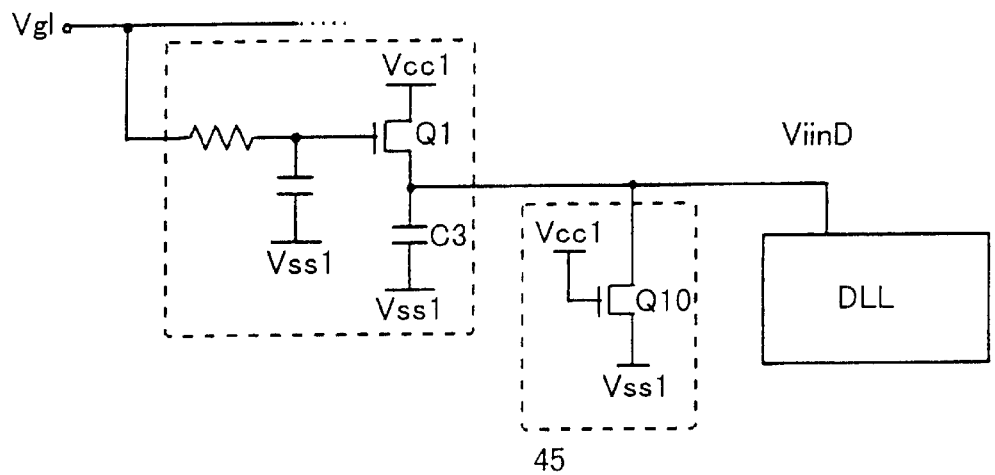
FIG. 18 is a view illustrating another example of an internal power source circuit for a DLL.

Accordingly, as shown in FIG. 18A, load means 45 consisting of a transistor Q10 that is normally conductive is provided between the source of transistor Q1 and earthing power source Vss1. This transistor Q10 is a current circuit that absorbs very small current. For example, this may be the very small current of about 0.01 mA. Thanks to the provision of such load means 45, current of about the amount of the sub-threshold current is abstracted from the source terminal of the transistor Q1 during power-down, thereby making it possible to prevent abnormal rise in the internal power source Vii as in FIG. 19A. Furthermore, since the current absorption is only slight, it does not result in increased current consumption during power-down.

Figure 19B:
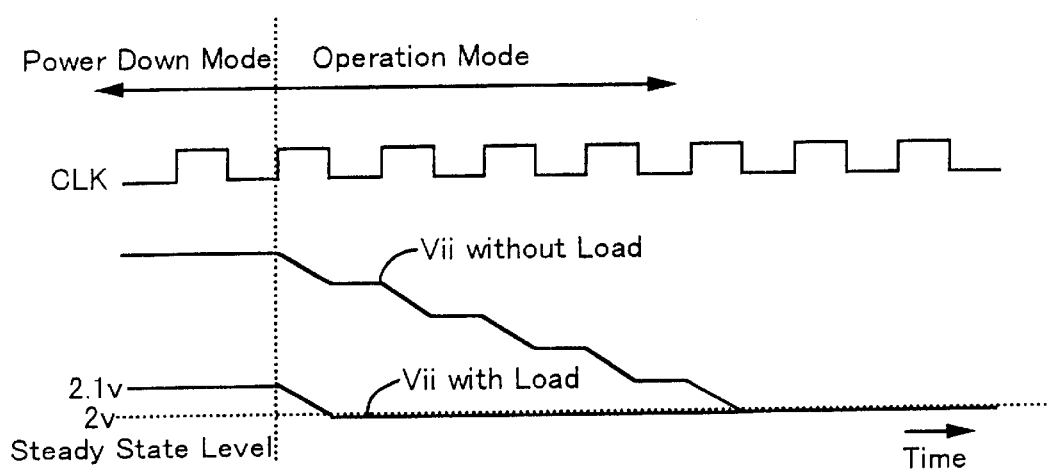

FIG. 19B shows the change of internal power source Vii when the load circuit 45 of FIG. 18A is provided and when this is not provided. Thanks to the provision of load circuit 45, the potential of internal power source Vii during power-down is maintained at a potential close to the normal-condition level. Consequently, on recovery from power-down, recovery to the normal-condition level can be achieved in about one clock cycle; this therefore enables the number of dummy clock cycles of the DLL circuit to be reduced.

Figure 18B:
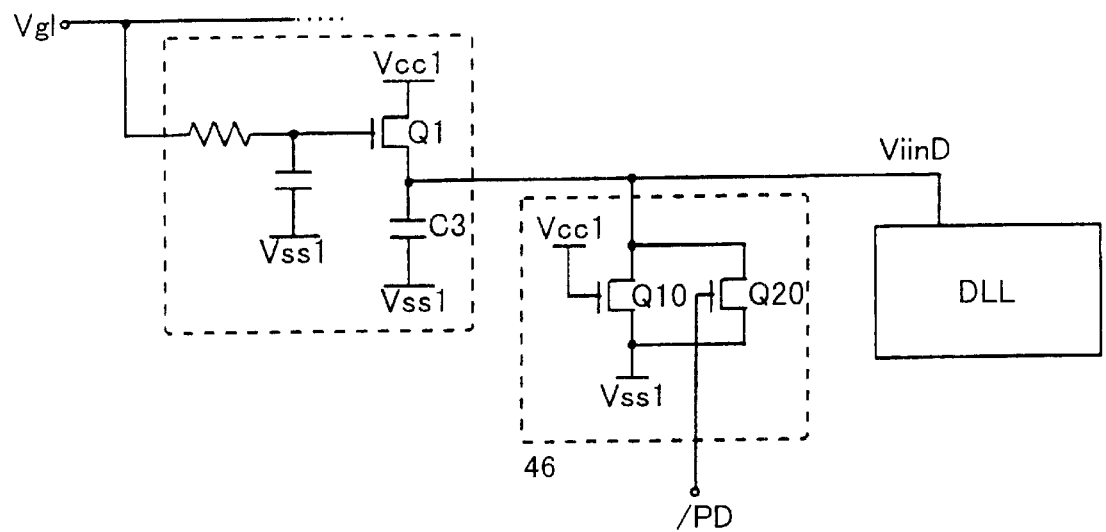

FIG. 18B shows a further improved internal power source circuit. In this circuit, as load means or current circuit, there is provided a small transistor Q10 that is always conductive and a large transistor Q20 that conducts in the active condition. In this variable load means 46, during power-down, only the small transistor Q10 conducts, absorbing for example a current of about 0.01 mA, preventing unstable rise of internal power source Vii. And in the active condition of variable load means 46, in addition to the small transistor Q10, large transistor Q20 also conducts, absorbing for example large current of about 0.1 m.

Figure 19C:
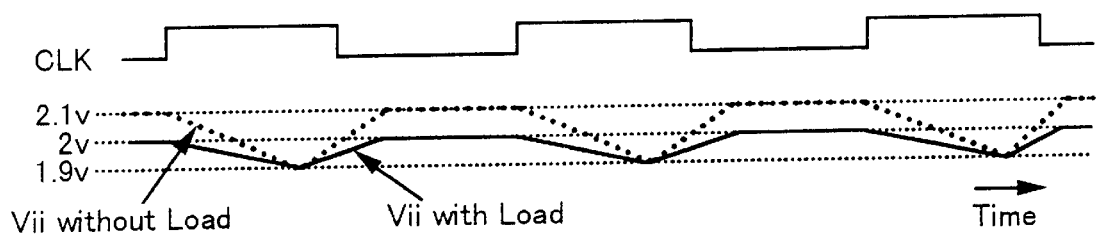

FIG. 19C shows the microscopic operation of internal power source Vii and clock CLK in the active condition. The DLL circuit is consuming current by performing some operation at the rising edge of the clock. Consequently, if no transistor Q20 is provided, as shown by the broken line of FIG. 19C, the internal power source Vii falls with the current consumption on the rising edge of clock CLK; subsequently internal power source Vii rises. In contrast, if transistor Q20 is provided, thereby performing a comparatively large current absorption, the ratio of change of current absorption produced by the DLL circuit referred to above with respect to the total current absorption becomes small. As a result, as shown by the continuous line in FIG. 19C, the fluctuation of internal power source Vii becomes small. That is, in the active condition, the current absorption capability of the variable load means is increased, making it possible to reduce the magnitude of the fluctuation accompanying the operation of the DLL circuit of internal power source Vii. In this way, internal power source Vii with a potential of better stability is supplied to the DLL circuit, thereby generating accurate and stable delay amounts, enabling the jitter of the control clock to be reduced.

[Isolation of the back bias power source]

Normally a back bias power source is applied to the channels of the transistors constituting the memory cells of a DRAM. This back bias power source has a potential level lower than the earthing power source and maintains the channel regions at potentials lower than the earthing power source; a reliable reverse-biased condition of the source and drain regions of the transistors is thereby produced, with the result that leakage current is not generated. When the channel regions are connected to the earthing power source, there is little reverse bias applied to the source and drain regions. Occurrence of power source noise on the earthing power source can therefore easily make the drain regions forward-biased, with the result that leakage current is easily produced. This leakage current produces fluctuation of the amount of charge of the capacitors of the cells or fluctuation of the bit line potentials, resulting in spurious operation. For this reason, back bias voltage is applied to the channels of the cell transistors.

This back bias power source is an internal power source that is generated through a comparatively higher impedance from the earthing power source, so the effect of power source noise of the earthing power source is small. Consequently, the threshold values of these transistors can be stabilized by applying this back bias power source to the channel regions of for example the delay units within the DLL circuit or transistors of the comparators, or the transistors of the gate voltage generating circuits of the internal power source systems for the DLL.

Furthermore, by separating the back bias power source into back bias power source utilized by circuits other than the DLL circuit, such as memory cells, and back bias power source utilized in the DLL circuit etc., the effect of noise generated in the back bias power sources by operation of the memory cells can be made small.

FIG. 20 is a diagram showing the separation of back bias power sources according to an embodiment. In the example shown in FIG. 20, back bias generating circuit 48 generates back bias power source VBB, but this is electrically divided by resistances R20, 30 into first back bias power source VBB1 and second back bias power source VBB2. Second back bias power source VBB2 is supplied to the transistors etc. of the memory cells in circuits other than the DLL circuit. Also, first back bias power source VBB1 is supplied to comparison unit 20A having a delay element of the phase comparison circuit and delay units 12B, 13B, 16B within the DLL circuit. Furthermore, first back bias power source VBB1 is also supplied to gate voltage generating circuit 5D for the DLL.

Even within the DLL circuit, second back bias power source VBB2 is supplied, as shown in the drawing, to portions that are not directly related to phase regulation. Specifically, such are portion 20B other than the delay elements of the phase comparison circuit and driver unit and/or output unit of the variable delay circuits.

Furthermore, first back bias power source VBB1 is connected to voltage VPR of the capacitor counter electrode (cell plate) of the memory cells through prescribed capacitors C30. The cell plates VPR of the memory cells themselves have large capacitance and are maintained at stable potential, for example Vii/2. Consequently, by connecting the first back bias power source VBBI to the cell plate voltage VPR through capacitor C30, generation of noise can be more effectively prevented.

FIG. 21 is a view showing application of back bias power source to a transistor in more detail according to the present embodiment. FIG. 21 shows the circuit of gates 201, 215 of the delay elements constituting comparison unit 20A of the phase comparison circuit and the circuit of gate voltage generating circuit 5D. First back bias power source VBB1 described in FIG. 20 is connected as shown by the broken lines to the channel regions of the NMOS transistors constituting the circuits of gates 201 and 215. The threshold voltage of the NMOS transistors is thereby stabilized so that it is not affected by noise. Also, since internal power source Vii7D is supplied to the channel of the PMOS transistors of these circuits, the threshold voltages of these transistors are stabilized, not being affected by noise. Consequently, the delay times of their gates are stabilized, not being affected by noise.

The gate circuits constituting the variable delay units in the variable delay circuits are basically the same as the gates 201, 215 of FIG. 21.

As shown in FIG. 21, first back bias power source VBB1 is further supplied, as shown by the broken line, also to the channel regions of the NMOS transistors N1, N2, N3, N4 constituting the gate voltage generating circuit 5D for the DLL. The threshold voltages of these transistors are also stabilized, being unaffected by power source noise. A capacitor C40 for the prevention of oscillation is connected to the output Vg1 of the gate voltage generating circuit. The capacitance of this capacitor C40 is set so as to prevent oscillation of the circuit by feedback action produced by the negative feedback circuit. The response action of the operational amplifier comprising transistors N1, N2, N3 varies in relation to this in accordance with the fluctuation of the threshold voltages of these transistors. Consequently, by stabilizing the threshold voltages of these transistors, oscillatory action is prevented, and the potential of gate voltage Vg1 can be stabilized.

Furthermore, gate voltage Vg1 is set higher, than the resistance division level of the potential of node n102 by the amount of the threshold voltage of transistor N4. Consequently, gate voltage Vg1 can also be stabilized by stabilizing the threshold voltage of this transistor N4. It should be noted that this threshold voltage can likewise be stabilized by supplying this first back bias power source VBB1 also to the channel region of transistor Q1 of the internal power source circuit shown in FIG. 17. As a result, the potential of the internal power source Vii can be stabilized, not being affected by noise.

It should be noted that, instead of the application of back bias voltage in the embodiments described above, first external earthing power source Vss1 could be applied to the channels of the transistors shown in FIG. 21. In cases where this first external earthing power source Vss1 cannot be utilized, as described above, back bias voltage VBB1, which is not subject to the effect of noise, can be utilized instead.

Figure 22:
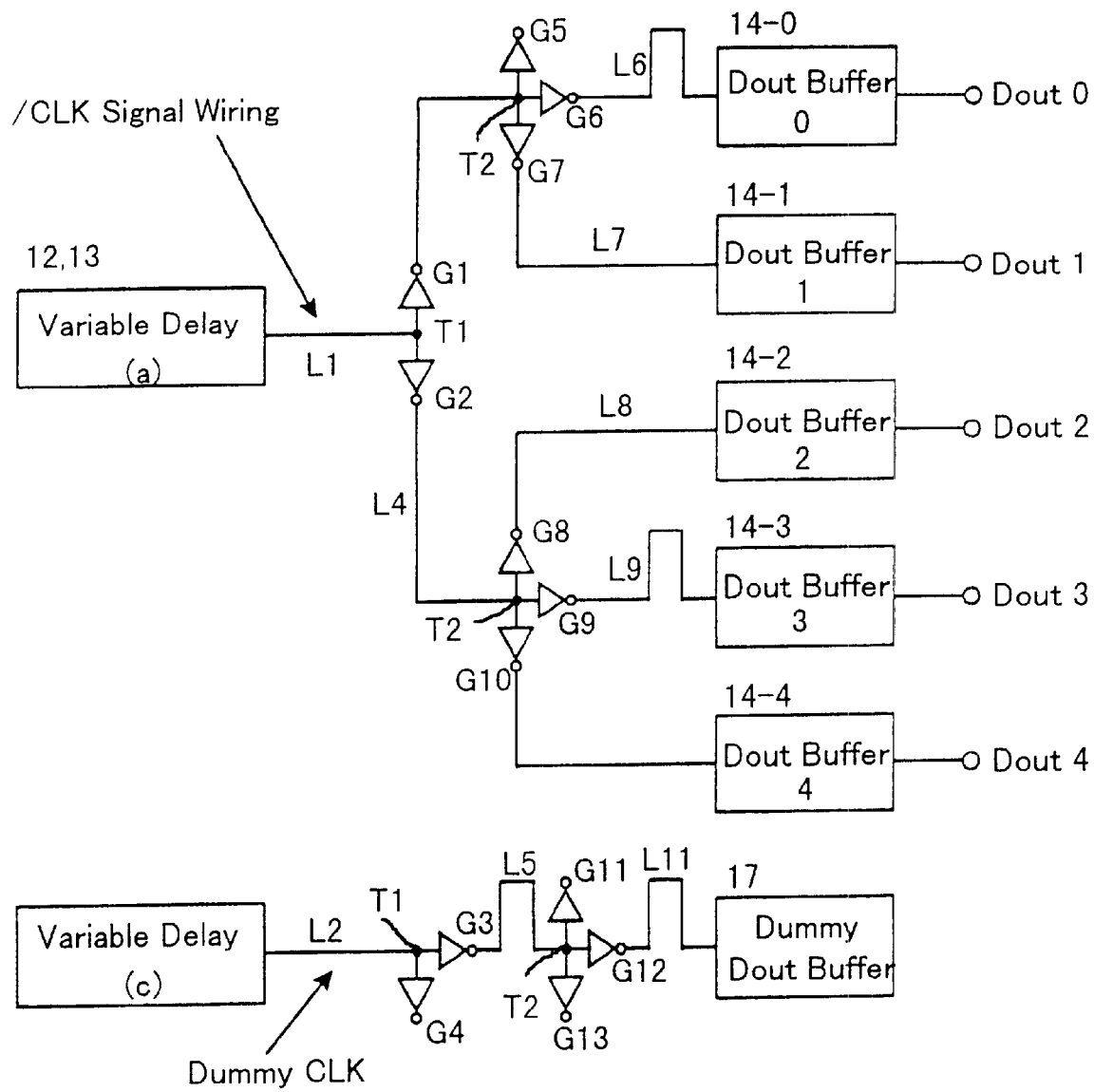

FIG. 22 is a view showing the layout of clock signal wiring from the variable delay circuit to the output buffer etc. Also, FIG. 23 is a view showing a more detailed example of the layout of this clock signal wiring. As shown in FIG. 22, the control clock /CLK1 that is generated by variable delay circuit 12 (identical with variable delay circuit 13) is supplied to a plurality of data output buffers 14-0 to 14-4. These output buffers are actuated simultaneously in response to the leading edge of control clock /CLK1 that is supplied. It is therefore demanded that the propagation delay time of the clock signal wiring from variable delay circuit 12 to these output buffers should be the same in all cases. It is demanded that the clock that is generated by the variable delay circuit 16 in the feedback loop of the DLL circuit should be supplied to dummy output buffer 17 with the same propagation delay time.

Accordingly, in this embodiment, the lengths of these clock signal wirings are all made the same. Specifically, the clock signal wirings from the delay control circuit 12 to the plurality of output buffers 14 have a tree structure, in which the distance between branch points Tn is the same and the distance from a branch point Tn to the output buffer is the same. Also, in regard to the signal wiring of the dummy clock on the feedback side, although this is not of tree structure, the distance between the respective branch points and the distance from a branch point to the dummy output buffer 17 is made the same as the corresponding distance of the signal wiring of the clock /CLK1 referred to above. That is, as shown in FIG. 22, the length of the wiring is set to L1=L2, L3=L4=L5, L6=L7=L8=L9=L10=L11.

Next, a buffer Gn for amplifying the clock is provided at each branch point Tn of the clock signal wiring. The rising edge or falling edge of the clock can be made steep by the provision of buffer Gn. By making both edges of the clock steep, it is possible to reduce the effects of power source noise to a low level. Specifically, as shown in FIG. 22, at branch point T1, there are provided buffers G1, G2 for respective branched wirings. Furthermore, at the other branch point T2, there are provided buffers G8, G9, G10 for three branched wirings. Corresponding to this, at another branch point T2, there are provided buffers G6, G7 for two branched wirings, and a dummy buffer G5.

Corresponding to this, only dummy clock signal wiring within the feedback loop, two buffers G3, G4 are provided at branch point T1. These buffers G3, G4 are buffers of the same size as buffers G1, G2. Also, on the dummy clock signal wiring, there are provided three buffers G11, G12 and G13 at branch point T2. These buffers G11 to G13 are of the same size as the corresponding buffers G5 to G10 and are buffers of the same drive capability.

Furthermore, regarding the number of buffers provided at branch points corresponding to these, these are set at equal numbers between the plurality of clock signal wirings. By doing this, the load capacity produced by the buffers can be made the same. Consequently, buffers G4, G11, G13 whose outputs are not connected are provided on dummy clock signal wirings within the feedback loop. Likewise, the output of buffer G5 is not connected.

By means of a construction as above, the delay times of the control clock /CLK1 and dummy clock on the signal wirings can be made to be the same.

Figure 23A:
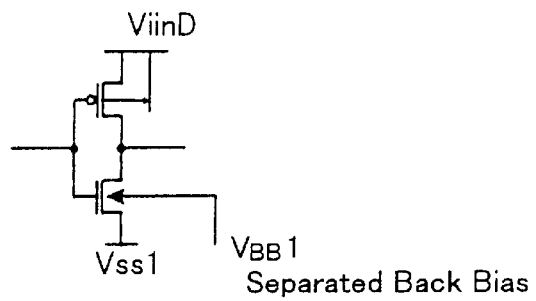
FIG. 23 is a view showing in more detail a constructional example of the clock signal wiring.

As shown in FIG. 23A, isolated back bias power source VBB1 is supplied to the channels of the NMOS transistors constituting buffers G1 to G13. The threshold values of the NMOS transistors can thereby be stabilized. External earthing power source Vss1 for the DLL is supplied at the source side of the NMOS transistors. Furthermore, the threshold voltages are stabilized by supplying internal power source ViinD for the DLL to the channels of the PMOS transistors.

Figure 23B:
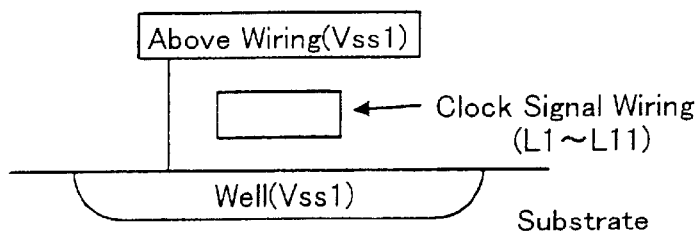
Figure 23C:
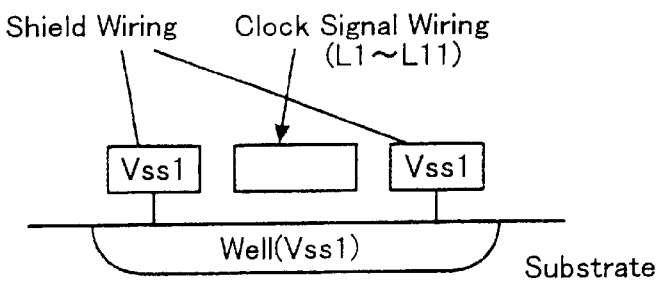

As shown in FIG. 23B, noise from other circuits is shielded by arranging the wiring of the first external earthing power source Vss1 above and below the clock signal wirings L1-L1. Alternatively, as shown in FIG. 23C, noise from other circuits is shielded by arranging the wiring of the first external earthing power source Vss1 in parallel on both sides of the clock signal wirings L1-L11. By means of such constructions, the effect of power source noise from the transmission of clocks can be eliminated.

Hereinabove embodiments of means for implementing a phase regulation function of high precision of a DLL circuit have been described. However, the present invention is not restricted to these embodiments and could be modified in various ways.

As described above, with the present invention, by supplying a DLL circuit that performs phase regulation of a clock with a dedicated external power source independent of other circuits, the accuracy of phase regulation of the DLL circuit can be increased, and jitter of the control clock that is generated can be reduced.

Furthermore, according to the present invention, by providing a dedicated internal power source circuit at portions that are most closely related to phase regulation, such as the variable delay units of the variable delays circuits within the DLL circuit and/or the delay elements of the comparison unit of the phase comparison circuit, the accuracy of phase regulation of the DLL circuit can be raised, and jitter of the control clock that is generated can be reduced.

Also, in a power source system for a DLL circuit, by performing various improvements, it is possible to arrange that power source noise from circuits other than the DLL circuit has no effect on the DLL circuit.

What is claimed is:

1. An integrated circuit device having a DLL circuit that generates a control clock having a phase which is adjusted by delaying a reference clock, wherein:

said DLL circuit comprises a first and second variable delay circuits that transmit said reference clocks having different frequencies respectively, wherein said first variable delay circuit generates said control clock and said second variable delay circuit generates a feedback clock for a phase comparison, and a plurality of first internal power source circuits supplied with an external power source and generating first internal power sources lower than said external power source; and said first and second variable delay circuits are supplied with said first internal power sources from respectively different first internal power source circuits.

2. The intergrated circuit device according to claim 1 wherein:

said plurality of first internal power source circuits have current supply capability corresponding to a current consumption of a corresponding variable delay circuit.

3. The integrated circuit device according to claim 1 wherein:

each of said first internal power source circuit has a current supply capability corresponding to a frequency of said reference clock that is supplied to a corresponding variable delay circuit.

4. An integrated circuit device comprising:

a DLL circuit that generates a control clock having a phase which is adjusted by delaying a reference clock, wherein:

said DLL circuit comprises a variable delay circuit that transmits said reference clock and a first and a second internal power source circuits that are supplied with an external power source and that generate a first and a second internal power sources lower than said external power source, and said variable delay circuit comprises a delay unit and a drive unit that drives said delay unit, said delay unit being supplied with said first internal power source from said first internal power source circuit and said drive unit being supplied with said second internal power source from said second internal power source.

5. An integrated circuit device comprising:

a DLL circuit that generates a control clock having a phase which is adjusted by delaying a reference clock, wherein:

said DLL circuit comprises a variable delay circuit that transmits said reference clock and a first internal power source circuit that is supplied with an external power source and that generates a first internal power source lower than said external power source, and said variable delay circuit comprises a delay unit and an output unit that outputs a clock delayed by said delay unit, said delay unit being supplied with said first internal power source from said first internal power source circuit and said output unit being supplied with a power source different from said first internal power source.

6. The integrated circuit device according to claim 5 further comprising:

an internal circuit being supplied with the control clock; and a first external power source supplied to said DLL circuit and a second external power source supplied to said internal circuit;

said variable delay circuit comprising a level conversion unit between said delay unit and output unit, and said first internal power source circuit being supplied with said first external power source, said output unit being supplied with said second external power source, and said level conversion unit being supplied with said first external power source.

7. The integrated circuit device according to claim 4 or 5 wherein:

said DLL circuit further comprises a delay control circuit that controls an amount of delay of said variable delay circuit and said delay control circuit is supplied with a power source different from said first internal power source.

8. The integrated circuit device according to claim 4 or 5, wherein:

said DLL circuit further comprises a frequency divider that divides a frequency of said reference clock and the frequency divider is supplied with a power source different from said first internal power source.

9. An integrated circuit device comprising a DLL circuit that generates a control clock having a phase which is adjusted by delaying a reference clock, comprising:

an internal circuit being supplied with the control clock; and a first external power source supplied to said DLL circuit and a second external power source supplied to said internal circuit;

said DLL circuit comprising a variable delay circuit that transmits said reference clock, a first internal power source circuit that is supplied with said first external power source and that generates a first internal power source lower than said first external power source, and a second internal power source circuit that is supplied with the second external power source and that generates a second internal power source lower than said second external power source; and said variable delay circuit comprising a delay unit and a drive unit that drives said delay unit, said delay unit being supplied with said first internal power source and said drive unit being supplied with said second internal power source.

10. The integrated circuit device according to claim 9 wherein:

said variable delay circuit further comprises an output unit that outputs a clock delayed from said delay unit and said output unit is supplied with said second internal power source.

11. An integrated circuit device comprising a DLL circuit that generates a control clock having a phase which is adjusted by delaying a reference clock, comprising:

an internal circuit being supplied with the control clock; and a first external power source that is supplied to said DLL circuit and a second external power source that is supplied to the internal circuit;

said DLL circuit comprising a plurality of variable delay circuits that transmit said reference clocks having different frequencies and a phase comparator that detects whether a phase difference of a delayed clock, delayed by the variable delay circuit, and said reference clock is less than a prescribed value, and a plurality of first internal power source circuits that are supplied with said first external power source and a prescribed control voltage and that generate a first internal power source lower than the first external power source;

said variable delay circuits and/or said phase comparator being respectively supplied with said first internal power source from the first internal power source circuits which are different each other.

12. The intergrated circuit device according to claim 11 wherein:

said first internal power source circuit comprises a source follower transistor having: a drain that is supplied with said first external power source, a gate that is supplied with said prescribed control voltage, and a source that generates said first internal power source, and a prescribed capacitor being connected between the source of said source follower transistor and a ground power source, there being further provided a current circuit that withdraws a prescribed current at the source.

13. The integrated circuit device according to claim 12 wherein:

said current circuit withdraws a first current in power-down mode and withdraws a second current, larger than said first current in non-power-down mode.

14. The integrated circuit device according to claim 11 wherein:

a low-pass filter is provided between a control voltage generating circuit that generates the control voltage and said first internal power source circuit.

15. The integrated circuit device according to claim 11 wherein:

a control voltage generating circuit that supplies said control voltage to said plurality of first internal power source circuits is provided in common to said first internal power source circuits.

16. The integrated circuit device according to claim 11 wherein:

a control voltage generating circuit that generates the control voltage comprises a differential amplification circuit one input of which is supplied with reference voltage and an output of which is fed back to the other input through a negative feedback circuit; said control voltage generating circuit being supplied with a prescribed boosted power source and a ground power source of said first external power source.

17. The integrated circuit device according to claim 11 wherein:

a control voltage generating circuit that generates said control voltage comprises a differential amplification circuit one input of which is supplied with reference voltage and an output of which is fed back to the other input through a negative feedback circuit, and a ground power source wiring of said first external power source is arranged in parallel in the vicinity of a resistive element provided in said negative feedback circuit.

18. The integrated circuit device according to claim 11 wherein:

said first internal power source circuit comprises a first transistor whose drain is supplied with said first external power source, whose gate is supplied with said prescribed control voltage, and whose source generates said first internal power source, said integrated circuit device further comprising:
power source circuit including a second transistor wherein said second external power source is supplied to a drain of the second transistor and a prescribed control voltage is supplied to a gate of the second transistor and a second internal power source lower than the second external power source is generated at a source of the second transistor, and first and second control voltage generating circuits which supply said control voltages to said first and second internal power source circuits respectively.

19. The integrated circuit device according to claim 11 further comprising:
a control voltage generating circuit supplied with a prescribed boosted power source and supplying the control voltage to said internal power source circuit; and
a boosted power source generating circuit that is supplied with said second external power source and that generates said boosted power source that is higher than said second external power source by a boosting operation.

20. The integrated circuit device according to claim 11 further comprising:
a second internal power source circuit, supplied with said second external power source, for generating a second internal power source lower than the second external power source;
a first control voltage generating circuit, supplied with a first boosted power source, for supplying said control voltages to said first and second internal power source circuits respectively;
a first boosted power source generating circuit that supplies said first boosted power source to said first control voltage generating circuit; and
a second boosted power source generating circuit that supplies a second boosted power source to the internal circuit;
wherein a voltage boosting capability of said first boosted power source generating circuit is smaller than a voltage boosting capability of said second boosted power source generating circuit.

21. The integrated circuit device according to claim 11 further comprising:
a second internal power source circuit supplied with said second external power source and generating a second internal power source lower than the second external power source;
a first control voltage generating circuit supplied with a first boosted power source and supplying said control voltage respectively to said first and second internal power source circuits;
a first boosted power source generating circuit that supplies said first boosted power source to said first control voltage generating circuit; and
a second boosted power source generating circuit that supplies a second boosted power source to the internal circuit,
wherein a voltage boosting action of said first boosted power source generating circuit is slower than a voltage boosting action of said second boosted power source generating circuit.

22. The integrated circuit device according to claim 11 further comprising:
a second internal power source circuit supplied with said second external power source and generating a second internal power source lower than the second external power source;
a first control voltage generating circuit supplied with a first boosted power source and supplying said control voltage respectively to said first and second internal power source circuits;
a first boosted power source generating circuit that supplies said first boosted power source to said first control voltage generating circuit; and
a second boosted power source generating circuit that supplies a second boosted power source to the internal circuit;
wherein a low-pass filter circuit is provided between said first boosted power source generating circuit and said first control voltage generating circuit.

23. An integrated circuit device comprising:
a DLL circuit that generates a control clock having a phase which is adjusted by delaying a reference clock, wherein
DLL circuit comprises a variable delay circuit having a delay unit that transmits said reference clock and a phase coincidence detection unit that detects when a phase difference of a delayed clock, delayed by the variable delay circuit, and said reference clock is less than a prescribed value; and
a supply wiring of a first back bias power source that is supplied to a channel of a first transistor constituting said delay unit or a second transistor constituting the phase coincidence detection unit is isolated from a supply wiring of a second back bias power source that is supplied to a channel of a third transistor of different circuit from the delay unit or the phase coincidence detection unit.

24. The integrated circuit device according to claim 23 further comprising:
a DLL internal power source circuit that is supplied with a prescribed control voltage and that supplies a first internal power source to said delay unit or phase coincidence detection unit; and
a control voltage generating circuit that is supplied with a prescribed boosted power source and that supplies a control voltage to said DLL internal power source circuit;
said first back bias power source being supplied to channels of fourth transistors constituting said control voltage generating circuit and said DLL internal power source circuit.

25. The integrated circuit device according to claim 23 or 24 wherein:
a prescribed capacitor is provided between a supply wiring of said first back bias power source and a voltage supply wiring of a cell plate of an internal memory cell.

26. An integrated circuit device including a DLL circuit that generates a control clock that is regulated in phase by delaying a reference clock, said DLL circuit comprising:
a first variable delay circuit which delays said reference clock to generate the control clock;
first clock wirings, which are practically equal length each other and have first buffer circuits provided at each branch points on the first clock wirings and amplifying the control clock, for respectively transferring the control clock to a plurality of internal circuits;
a second variable delay circuit which delays said reference clock to generates a feedback clock;
a second clock wiring, which has practically equal length to the first clock wirings and has second buffer circuits for amplifying the feedback clock, a number of the second buffer circuits being equal to the first buffer circuits on each said first clock wiring, for transferring the feedback clock to a dummy internal circuit; and a phase comparison circuit which compares the phase of the feedback clock propagated via said dummy internal circuit and the reference clock, and controls the delay of the first and second variable delay circuits to match the phases of the feedback clock and the reference clock with a predetermined phase relation.

27. The integrated circuit device according to claim 26 wherein:

a number of said buffer circuits provided at positions of approximately equal distance from said DLL circuit is equal among said clock signal wirings.

28. The integrated circuit device according to claim 26 wherein:

a drive capability of said buffer circuits that are provided at positions of approximately equal distance from said DLL circuit is substantially equal among said clock signal wirings.

29. The integrated circuit device according to claim 26 wherein:

a first supply wiring of a back bias power source that is supplied to a channel of a first transistor constituting said buffer circuit is isolated from a second supply wiring that supplies the back bias power source to a second transistor of a circuit other than said DLL circuit.

30. The integrated circuit device according to claim 26 wherein:

a wiring of a ground power source is provided in the vicinity of said clock signal wirings of equal length.

* * * * *